US012635539B2

(12) United States Patent
Jang et al.

(10) Patent No.: US 12,635,539 B2
(45) Date of Patent: May 19, 2026

(54) INTERPOSER STRUCTURE AND SEMICONDUCTOR PACKAGE INCLUDING THE SAME

(71) Applicant: SAMSUNG ELECTRONICS CO., LTD., Suwon-si (KR)

(72) Inventors: Woo Seong Jang, Suwon-si (KR); Won Ji Park, Suwon-si (KR); Jeong Hoon Ahn, Seongnam-si (KR); Jae Hee Oh, Seongnam-si (KR); Ji Hyung Kim, Seoul (KR); Shaofeng Ding, Suwon-si (KR); Seok Jun Hong, Suwon-si (KR); Je Gwan Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 850 days.

(21) Appl. No.: 17/811,342

(22) Filed: Jul. 8, 2022

(65) Prior Publication Data

US 2023/0170289 A1     Jun. 1, 2023

(30) Foreign Application Priority Data

Nov. 29, 2021    (KR) ........................ 10-2021-0166696

(51) Int. Cl.
  *H01L 23/498*     (2006.01)
  *H01L 23/00*      (2006.01)
    (Continued)
(52) U.S. Cl.
  CPC .. *H01L 23/49838* (2013.01); *H01L 23/49822* (2013.01); *H01L 23/49833* (2013.01);
    (Continued)

(58) Field of Classification Search
  CPC .......... H10D 1/042; H10D 1/68; H10D 1/692; H10D 1/716; H01L 2224/16227;
    (Continued)

(56) References Cited

U.S. PATENT DOCUMENTS

| | | | |
|---|---|---|---|
| 7,405,366 B2 | 7/2008 | Shioga et al. | |
| 8,895,385 B2 | 11/2014 | Chang et al. | |
| (Continued) | | | |

FOREIGN PATENT DOCUMENTS

| | | |
|---|---|---|
| CN | 104051229 A | 9/2014 |
| CN | 112885831 A | 6/2021 |
| (Continued) | | |

*Primary Examiner* — Matthew C Landau
*Assistant Examiner* — Dmitriy Yemelyanov
(74) *Attorney, Agent, or Firm* — Muir Patent Law, PLLC

(57)                 ABSTRACT

An interposer structure includes an interposer substrate, an interlayer insulating layer on an upper surface of the interposer substrate, a capacitor structure inside the interlayer insulating layer, a first via which penetrates the interlayer insulating layer in a vertical direction, the first via being connected to the capacitor structure, an insulating layer on the interlayer insulating layer, a second via which penetrates the insulating layer in the vertical direction, the second via being connected to the first via, and a through via which completely penetrates each of the interposer substrate, the interlayer insulating layer, and the insulating layer in the vertical direction, an upper surface of the through via being coplanar with an upper surface of the second via.

18 Claims, 17 Drawing Sheets

(51) Int. Cl.

| | |
|---|---|
| *H01L 23/538* | (2006.01) |
| *H01L 23/64* | (2006.01) |
| *H01L 25/065* | (2023.01) |
| *H10D 1/00* | (2025.01) |
| *H10D 1/68* | (2025.01) |

(52) U.S. Cl.

CPC ...... *H01L 23/5385* (2013.01); *H01L 23/5386* (2013.01); *H01L 23/642* (2013.01); *H01L 25/0655* (2013.01); *H10D 1/042* (2025.01); *H10D 1/716* (2025.01); *H01L 23/49816* (2013.01); *H01L 24/16* (2013.01); *H01L 2224/16227* (2013.01); *H01L 2224/16238* (2013.01); *H01L 2924/1431* (2013.01); *H01L 2924/1432* (2013.01); *H01L 2924/1433* (2013.01); *H01L 2924/1434* (2013.01); *H01L 2924/37001* (2013.01)

(58) Field of Classification Search

CPC ..... H01L 2224/16238; H01L 23/49816; H01L 23/49822; H01L 23/49833; H01L 23/49838; H01L 23/5383; H01L 23/5384; H01L 23/5385; H01L 23/5386; H01L 23/642; H01L 24/16; H01L 25/0655; H01L 25/16; H01L 25/18; H01L 2924/1431; H01L 2924/1432; H01L 2924/1433; H01L 2924/1434; H01L 2924/37001

See application file for complete search history.

(56) References Cited

U.S. PATENT DOCUMENTS

| | | | | |
|---|---|---|---|---|
| 9,673,270 | B2 | 6/2017 | Lai et al. | |
| 2005/0024979 | A1* | 2/2005 | Kim | H10D 1/696 |
| | | | | 365/232 |
| 2007/0076348 | A1* | 4/2007 | Shioga | H01G 4/232 |
| | | | | 361/307 |
| 2012/0319239 | A1* | 12/2012 | Chang | H01L 23/642 |
| | | | | 257/532 |
| 2013/0187287 | A1* | 7/2013 | Park | H01L 21/76831 |
| | | | | 257/774 |
| 2018/0226349 | A1* | 8/2018 | Yu | H01L 21/568 |
| 2020/0075712 | A1* | 3/2020 | Ding | H10D 64/667 |
| 2021/0013162 | A1* | 1/2021 | Zhang | H10D 1/043 |

FOREIGN PATENT DOCUMENTS

| | | | |
|---|---|---|---|
| JP | 2007-096232 | A | 4/2007 |
| JP | 2008-130901 | A | 6/2008 |
| KR | 10-2012-0000748 | A | 1/2012 |
| KR | 10-2021-0047043 | A | 4/2021 |

* cited by examiner

<u>100</u>

INTERPOSER STRUCTURE AND SEMICONDUCTOR PACKAGE INCLUDING THE SAME

CROSS-REFERENCE TO RELATED APPLICATION

This application claims priority from Korean Patent Application No. 10-2021-0166696, filed on Nov. 29, 2021, in the Korean Intellectual Property Office and all the benefits accruing therefrom under 35 U.S.C. 119, the contents of which in its entirety are herein incorporated by reference.

BACKGROUND

1. Field

The present disclosure relates to an interposer structure and a semiconductor package including the same.

2. Description of the Related Art

Signal and power integrity of high-performance chips have grown in importance due to integration and miniaturization of semiconductor circuits. Therefore, there is an increasing need for a silicon interposer for interconnecting a plurality of chips, e.g., a system-on-chip (SOC) and high bandwidth memory (HBM) chips. Further, interposer capacitors are also under development.

SUMMARY

According to some embodiments of the present disclosure, there is provided a semiconductor package, including an interposer substrate, an interlayer insulating layer disposed on an upper surface of the interposer substrate, a capacitor structure disposed inside the interlayer insulating layer, a first via which penetrates the interlayer insulating layer in a vertical direction and is connected to the capacitor structure, an insulating layer disposed on the interlayer insulating layer, a second via which penetrates the insulating layer in the vertical direction and is connected to the first via, and a through via which completely penetrates each of the interposer substrate, the interlayer insulating layer and the insulating layer in the vertical direction, wherein an upper surface of the second via is formed on the same plane as an upper surface of the through via.

According to some embodiments of the present disclosure, there is provided a semiconductor package, including an interposer substrate, a first etching stop layer disposed on an upper surface of the interposer substrate, a first interlayer insulating layer disposed on the first etching stop layer, a second etching stop layer disposed on the first interlayer insulating layer, a second interlayer insulating layer disposed on the second etching stop layer, a capacitor structure disposed inside the first and second interlayer insulating layers, a third etching stop layer disposed on the second interlayer insulating layer, a first via which penetrates each of the second interlayer insulating layer and the second etching stop layer in a vertical direction and is connected to the capacitor structure, an insulating layer disposed on the third etching stop layer, a second via which penetrates each of the insulating layer and the third etching stop layer in the vertical direction, and is connected to the first via, and a through via which completely penetrates each of the interposer substrate, the first to third etching stop layers, the first and second interlayer insulating layers, and the insulating layer in the vertical direction, wherein the insulating layer extends along side walls of the through via to a lower surface of the interposer substrate.

According to some embodiments of the present disclosure, there is provided a semiconductor package, including a package substrate, an interposer substrate disposed on the package substrate, an interlayer insulating layer disposed on an upper surface of the interposer substrate, a capacitor structure disposed inside the interlayer insulating layer, a first via which penetrates the interlayer insulating layer in a vertical direction and is connected to the capacitor structure, an insulating layer disposed on the interlayer insulating layer, a second via which penetrates the insulating layer in the vertical direction and is connected to the first via, a first wiring pattern disposed on a lower surface of the interposer substrate, a redistribution layer which is disposed on the insulating layer and includes a second wiring pattern, a through via which completely penetrates each of the interposer substrate, the interlayer insulating layer and the insulating layer in the vertical direction, and is in contact with each of the first wiring pattern and the second wiring pattern, a first semiconductor chip disposed on an upper surface of the redistribution layer, and a second semiconductor chip which is disposed on the upper surface of the redistribution layer, spaced apart from the first semiconductor chip in a horizontal direction, and electrically connected to the first semiconductor chip through the redistribution layer, wherein an upper surface of the second via is formed on the same plane as an upper surface of the through via.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, an interposer structure according to some embodiments of the present disclosure will be described referring to FIGS. 1 and 2.

Figure 1:
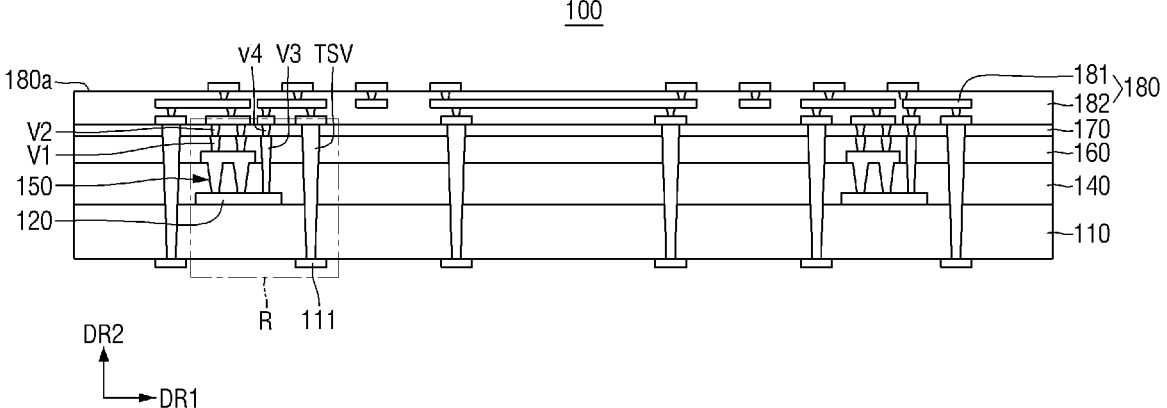
FIG. 1 is a diagram of an interposer structure according to some embodiments of the present disclosure.

FIG. 1 is a cross-sectional view of an interposer structure according to some embodiments of the present disclosure. FIG. 2 is an enlarged view of region R of FIG. 1.

Figure 2:
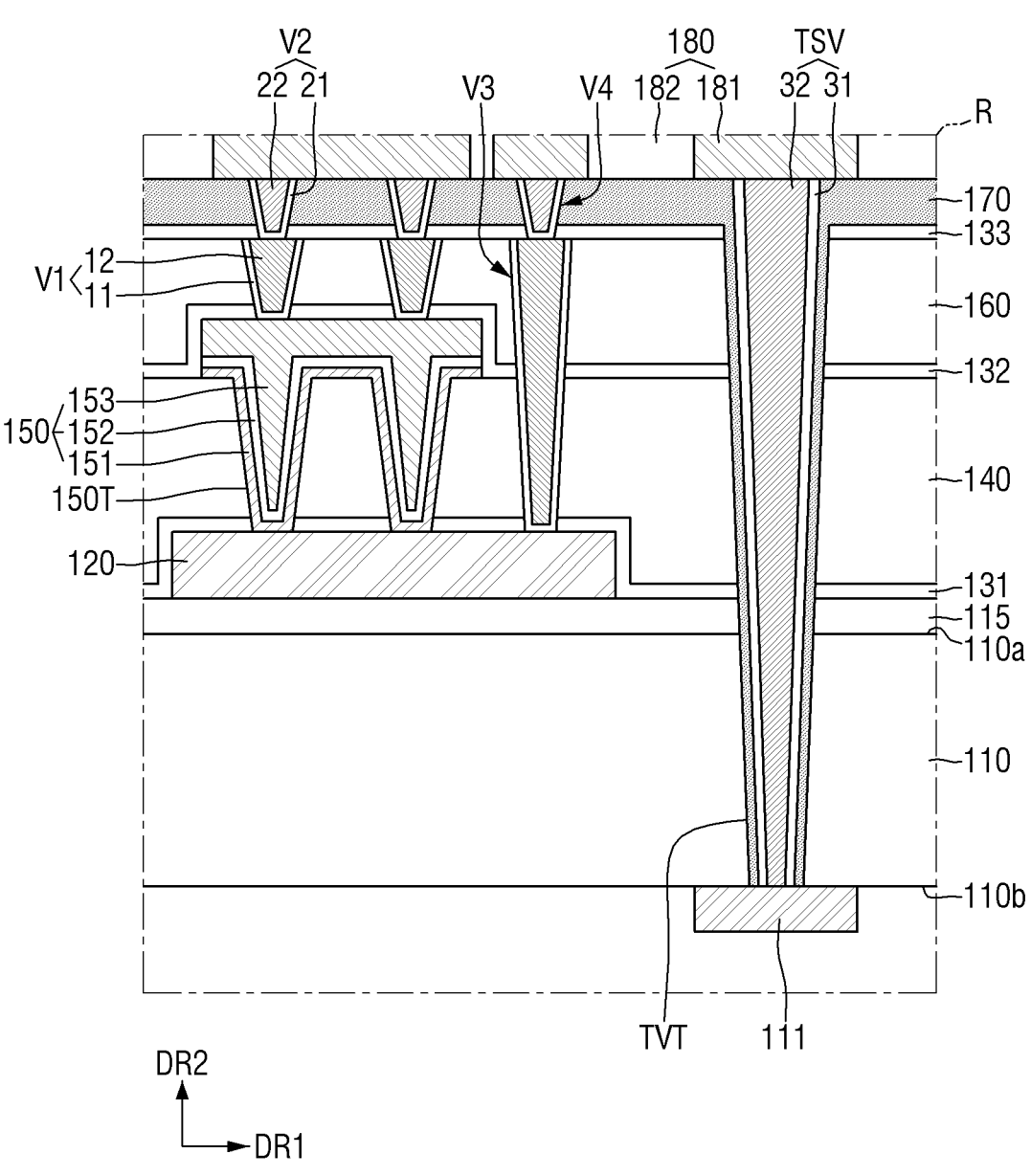
FIG. 2 is an enlarged view of region R of FIG. 1.

Referring to FIGS. 1 and 2, an interposer structure according to some embodiments of the present disclosure may include an interposer substrate 110, a first wiring pattern 111, a planarization insulation layer 115, a connecting pattern 120, first to third etching stop layers 131, 132, and 133, a first interlayer insulating layer 140, a capacitor structure 150, a second interlayer insulating layer 160, an insulating layer 170, a redistribution layer 180, first to fourth vias V1 to V4, and a through via TSV.

The interposer substrate 110 may be, e.g., any one of a silicon substrate, a gallium arsenide substrate, a silicon germanium substrate, a ceramic substrate, a quartz substrate, a glass substrate, and an SOI (Semiconductor On Insulator) substrate. Hereinafter, the interposer substrate 110 will be described as a silicon substrate, as an example.

The interposer substrate 110 may function as a support substrate of an interposer structure 100. The interposer substrate 110 may be a functional package substrate disposed between the package substrate (1000 of FIG. 17) and the semiconductor chip (1100 or 1200 of FIG. 17). That is, the interposer substrate 110 is different from a semiconductor substrate on which an active element e.g., a transistor, is formed, e.g., the interposer substrate 110 may have a different scale, application, and the like from those of the semiconductor substrate, e.g., the interposer substrate 110 may not include active elements therein (e.g., between upper and lower surfaces of the interposer substrate 110). For example, unlike a system on chip (SoC), the interposer structure 100 including the interposer substrate 110 may include thereon semiconductor chips having different physical properties, and may exhibit a high packaging yield.

The first wiring pattern 111 may be disposed on a lower surface 110*b* of the interposer substrate 110. The first wiring pattern 111 may be a portion by which the interposer structure 100 is electrically connected to another external configuration. The first wiring pattern 111 may include a conductive material.

The planarization insulation layer 115 may be disposed on an upper surface 110*a* of the interposer substrate 110. For example, the planarization insulation layer 115 may be disposed conformally. For example, the planarization insulation layer 115 may include silicon oxide. The connecting pattern 120 may be disposed on the planarization insulation layer 115. The connecting pattern 120 may extend in a horizontal direction DR1 along a part of the upper surface of the planarization insulation layer 115. The connecting pattern 120 may include a conductive material.

The first etching stop layer 131 may be disposed on the planarization insulation layer 115 and the connecting pattern 120. For example, the first etching stop layer 131 may be disposed along the upper surface of the planarization insulation layer 115, and side walls and an upper surface of the connecting pattern 120. For example, the first etching stop layer 131 may be disposed conformally.

The first etching stop layer 131 may include, e.g., silicon nitride, silicon oxynitride, silicon carbonitride, and the like. In some other embodiments, the first etching stop layer 131 may include a metal, e.g., aluminum (Al).

The first interlayer insulating layer 140 may be disposed on the first etching stop layer 131. For example, the upper surface of the first interlayer insulating layer 140 may be formed at the same height, e.g., a surface of the first interlayer insulating layer 140 facing away from the interposer substrate 110 may be at a constant distance from the upper surface 110*a* of the interposer substrate 110. The first interlayer insulating layer 140 may include, e.g., at least one of silicon oxide, silicon nitride, silicon oxynitride, and low dielectric constant (low-k) material having a lower dielectric constant than silicon oxide.

The capacitor structure 150 may be disposed on the connecting pattern 120. The capacitor structure 150 may be in contact with the connecting pattern 120. A part of the capacitor structure 150 may be disposed inside the first interlayer insulating layer 140, e.g., a part of the capacitor structure 150 may extend through the first interlayer insulating layer 140 and the first etching stop layer 131 to contact the connecting pattern 120. For example, a part of the capacitor structure 150 may be disposed inside a capacitor trench 150T formed inside the first interlayer insulating layer 140. The capacitor trench 150T may extend in a vertical direction DR2 from the upper surface of the connecting pattern 120 to the upper surface of the first interlayer insulating layer 140. Here, the vertical direction DR2 may be defined as a direction perpendicular to the horizontal direction DR1. The capacitor structure 150 may include a lower electrode 151, a capacitor dielectric layer 152, and an upper electrode 153.

The lower electrode 151 may be disposed along side walls and a bottom surface of the capacitor trench 150T. Further, the lower electrode 151 may also be disposed on the upper surface of the first interlayer insulating layer 140 adjacent to the side walls of the capacitor trench 150T. For example, the lower electrode 151 may be disposed conformally.

The lower electrode 151 may include a conductive material. The lower electrode 151 may include, e.g., at least one of titanium (Ti), titanium nitride (TiN), tantalum (Ta), tantalum nitride (TaN), tungsten nitride (WN), metal silicide, and combinations thereof.

The capacitor dielectric layer 152 may be disposed on the lower electrode 151 inside the capacitor trench 150T. Further, the capacitor dielectric layer 152 may also be disposed on the lower electrode 151 disposed on the upper surface of the first interlayer insulating layer 140 adjacent to the side walls of the capacitor trench 150T. For example, the capacitor dielectric layer 152 may be disposed conformally.

The capacitor dielectric layer 152 may include, e.g., silicon oxide, silicon nitride, silicon oxynitride, and a high dielectric constant (high-k) material having a higher dielectric constant than silicon oxide. The high dielectric constant material may include, e.g., at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The upper electrode 153 may be disposed on the capacitor dielectric layer 152 inside the capacitor trench 150T. The upper electrode 153 may completely fill the remaining portions of the interior of the capacitor trench 150T. Further, the upper electrode 153 may also be disposed on the capacitor dielectric layer 152 disposed on the upper surface of the first interlayer insulating layer 140 adjacent to the side walls of the capacitor trench 150T. For example, the upper surface of the upper electrode 153 may be formed at the same height, e.g., at a constant distance from the upper surface 110*a* of the interposer substrate 110.

The upper electrode 153 may include a conductive material. The upper electrode 153 may include, e.g., at least one of titanium (Ti), titanium nitride (TiN), tantalum (Ta), tantalum nitride (TaN), tungsten nitride (WN), metal silicide, and a combination thereof.

For example, the side walls of the lower electrode 151, the side walls of the capacitor dielectric layer 152, and the side walls of the upper electrode 153 disposed on the upper surface of the first interlayer insulating layer 140 may be aligned in the vertical direction DR2. In other words, as illustrated in FIG. 2, the side walls of portions of the lower electrode 151, the capacitor dielectric layer 152, and the side walls of the upper electrode 153 positioned, e.g., protruding, above the upper surface of the first interlayer insulating layer 140 may be aligned with each other in the vertical direction DR2.

A second etching stop layer 132 may be disposed on the first interlayer insulating layer 140, e.g., the first interlayer insulating layer 140 may be between the first and second etching stop layers 131 and 132. Further, the second etching stop layer 132 may be disposed along the side walls and the upper surface of the capacitor structure 150 protruding from, e.g., above, the upper surface of the first interlayer insulating layer 140 in the vertical direction DR2. For example, the second etching stop layer 132 may be disposed conformally.

The second etching stop layer 132 may include, e.g., silicon nitride, silicon oxynitride, silicon carbonitride, and the like. In some other embodiments, the second etching stop layer 132 may include a metal, e.g., aluminum (Al).

The second interlayer insulating layer 160 may be disposed on the second etching stop layer 132. For example, the upper surface of the second interlayer insulating layer 160 may be formed at the same height, e.g., at a constant distance from the upper surface 110$a$ of the interposer substrate 110. The second interlayer insulating layer 160 may include, e.g., at least one of silicon oxide, silicon nitride, silicon oxynitride, and a low dielectric constant (low-k) material having a lower dielectric constant than silicon oxide.

A first via V1 may be disposed on the capacitor structure 150. The first via V1 may penetrate the second interlayer insulating layer 160 and the second etching stop layer 132 in the vertical direction DR2, and may be, e.g., physically and electrically, connected to the capacitor structure 150. The first via V1 may include a first via barrier layer 11 and a first via filling layer 12.

The first via barrier layer 11 may form side walls and a bottom surface of the first via V1. The first via barrier layer 11 may include, e.g., at least one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and combinations thereof.

The first via filling layer 12 may be disposed on the first via barrier layer 11. The first via filling layer 12 may include, e.g., tungsten (W). In some other embodiments, the first via filling layer 12 may include, e.g., at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), ruthenium (Ru), iridium (Ir), and rhodium (Rh).

A third via V3 may be disposed on, e.g., adjacent to, the side walls of the capacitor structure 150. The third via V3 may penetrate the first etching stop layer 131, the first interlayer insulating layer 140, the second etching stop layer 132, and the second interlayer insulating layer 160 in the vertical direction DR2, and may be, e.g., physically and electrically, connected to the connecting pattern 120. The third via V3 may be spaced apart from the capacitor structure 150 in the horizontal direction DR1.

The third via V3 may include the first via barrier layer 11 and the first via filling layer 12, in the same manner as the first via V1. The third via V3 and the first via V1 may include the same material as each other. The upper surface of the third via V3 may be formed on the same plane as the upper surface of the first via V1, e.g., the upper surfaces of the third via V3 and the first via V1 may be level with each other.

A third etching stop layer 133 may be disposed on the second interlayer insulating layer 160. The third etching stop layer 133 may be disposed on at least a part of the upper surface of the first via V1 and at least a part of the upper surface of the third via V3. The third etching stop layer 133 may include, e.g., at least one of silicon nitride, silicon oxynitride, silicon carbonitride, and the like. In some other embodiments, the second etching stop layer 132 may include a metal, e.g., aluminum (Al).

A through via trench TVT may be formed on, e.g., adjacent to, the side walls of the connecting pattern 120. The through via trench TVT may penetrate the interposer substrate 110, the planarization insulation layer 115, the first etching stop layer 131, the first interlayer insulating layer 140, the second etching stop layer 132, the second interlayer insulating layer 160, and the third etching stop layer 133 in the vertical direction DR2. The through via trench TVT may extend, e.g., continuously, from the lower surface 110$b$ of the interposer substrate 110 to the upper surface of the third etching stop layer 133.

The insulating layer 170 may be disposed on the third etching stop layer 133. The upper surface of the insulating layer 170 may be formed at the same height, e.g., at a constant distance from the upper surface 110$a$ of the interposer substrate 110. The insulating layer 170 may be disposed along the side walls of the through via trench TVT. The insulating layer 170 may extend along the side walls of the through via trench TVT to the lower surface 110$b$ of the interposer substrate 110. The insulating layer 170 may be in contact with the first wiring pattern 111. For example, the insulating layer 170 may be conformally disposed on the side walls of the through via trench TVT.

For example, a thickness in the vertical direction DR2 of the insulating layer 170 disposed on the third etching stop layer 133 may be greater than a thickness of the insulating layer 170 disposed on the side walls and the bottom surface of the through via trench TVT. The insulating layer 170 may include, e.g., silicon oxide. In some other embodiments, the insulating layer 170 may include, e.g., at least one of silicon oxycarbide (SiOC) and silicon oxycarbonitride (SiOCN).

A second via V2 may be disposed on the first via V1. The second via V2 may penetrate the insulating layer 170 and the third etching stop layer 133 in the vertical direction DR2 and may be, e.g., physically and electrically, connected to the first via V1. An upper surface of the second via V2 may be formed on the same plane as, e.g., level with, the upper surface of the insulating layer 170.

A width in the horizontal direction DR1 of the lower surface of the second via V2 may be different from a width in the horizontal direction DR1 of the upper surface of the first via V1. For example, the width in the horizontal direction DR1 of the upper surface of the first via V1 may be greater than the width in the horizontal direction DR1 of the lower surface of the second via V2. The second via V2 may include a second via barrier layer 21 and a second via filling layer 22.

The second via barrier layer 21 may form side walls and a bottom surface of the second via V2. The second via barrier layer 21 may include, e.g., at least one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and combinations thereof.

A second via filling layer 22 may be disposed on the second via barrier layer 21. The second via filling layer 22 may include, e.g., at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Ir), and rhodium (Rh). For example, the second via filling layer 22 may include a different material from the first via filling layer 12. For example, the second via filling layer 22 may include copper (Cu), and the first via filling layer 12 may include tungsten (W).

A fourth via V4 may be disposed on the third via V3. The fourth via V4 may penetrate the insulating layer 170 and the third etching stop layer 133 in the vertical direction DR2, and may be, e.g., physically and electrically, connected to the third via V3. The width in the horizontal direction DR1 of a lower surface of the fourth via V4 may be different from the width in the horizontal direction DR1 of the upper surface of the third via V3. For example, the width in the horizontal direction DR1 of the upper surface of the third via V3 may be larger than the width in the horizontal direction DR1 of the lower surface of the fourth via V4.

The fourth via V4 may include the second via barrier layer 21 and the second via filling layer 22 in the same manner as the second via V2. The fourth via V4 and the second via V2 may include the same material as each other. The upper surface of the fourth via V4 is formed on the same plane as, e.g., level with, each of the upper surface of the second via V2 and the upper surface of the insulating layer 170.

The through via TSV may be disposed inside each of the through via trench TVT and the insulating layer 170. The through via TSV may, e.g., continuously, penetrate, e.g., the entirety of, the interposer substrate 110, the planarization insulation layer 115, the first etching stop layer 131, the first interlayer insulating layer 140, the second etching stop layer 132, the second interlayer insulating layer 160, the third etching stop layer 133, and the insulating layer 170 in the vertical direction DR2.

The through via TSV may extend in the vertical direction DR2 from the lower surface 110b of the interposer substrate 110 to the upper surface of the insulating layer 170. A part of the insulating layer 170 may extend along the side walls of the through via TSV to the lower surface 110b of the interposer substrate 110. For example, the side walls of the through via TSV may be completely surrounded, e.g., covered, by the insulating layer 170.

The through via TSV may be in, e.g., direct, contact with the first wiring pattern 111 disposed on the lower surface 110b of the interposer substrate 110. Further, the through via TSV may be in, e.g., direct, contact with the second wiring pattern 181 disposed on the upper surface of the insulating layer 170. The upper surface of the through via TSV may be formed on the same plane as, e.g., level with, each of the upper surface of the second via V2, the upper surface of the fourth via V4, and the upper surface of the insulating layer 170. The through via TSV may include a through via barrier layer 31 and a through via filling layer 32.

The through via barrier layer 31 may form a side wall of the through via TSV. The through via barrier layer 31 may be in contact with each of the first wiring pattern 111 and the second wiring pattern 181. The through via barrier layer 31 may include, e.g., at least one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and combinations thereof.

The through via filling layer 32 may be disposed between the through via barrier layers 31. The through via filling layer 32 may be in contact with each of the first wiring pattern 111 and the second wiring pattern 181. The through via filling layer 32 may include, e.g., at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Ir), and rhodium (Rh). For example, the through via filling layer 32 may include the same material as the second via filling layer 22. The through via filling layer 32 may include a material different from that of the first via filling layer 12. For example, the through via filling layer 32 may include copper (Cu), and the first via filling layer 12 may include tungsten (W).

The redistribution layer 180 may be disposed on the upper surface of the insulating layer 170. The redistribution layer 180 may be disposed on the upper surface of the second via V2, the upper surface of the fourth via V4, and the upper surface of the through via TSV. The redistribution layer 180 may include a second wiring pattern 181 and a third interlayer insulating layer 182.

The second wiring pattern 181 may include a plurality of wirings spaced apart from each other in the horizontal direction DR1 and the vertical direction DR2, and a via that connects the plurality of wirings. For example, a part of the second wiring pattern 181 may be exposed from, e.g., through, an upper surface 180a of the redistribution layer 180. A part of the second wiring pattern 181 exposed from the upper surface 180a of the redistribution layer 180 may be a portion by which the interposer structure 100 is electrically connected to another external configuration. The second wiring pattern 181 may include a conductive material.

The third interlayer insulating layer 182 may surround the second wiring pattern 181. The third interlayer insulating layer 182 may include, e.g., at least one of a silicon oxide, a silicon nitride, a silicon oxynitride, and a low dielectric constant (low-k) material having a dielectric constant lower than that of the silicon oxide.

Hereinafter, a method for manufacturing an interposer structure according to some embodiments of the present disclosure will be described referring to FIGS. 1 to 13.

FIGS. 3 to 13 are stages in a method for manufacturing an interposer structure according to some embodiments of the present disclosure. FIGS. 3 to 13 correspond to region R in FIG. 2.

Figure 3:
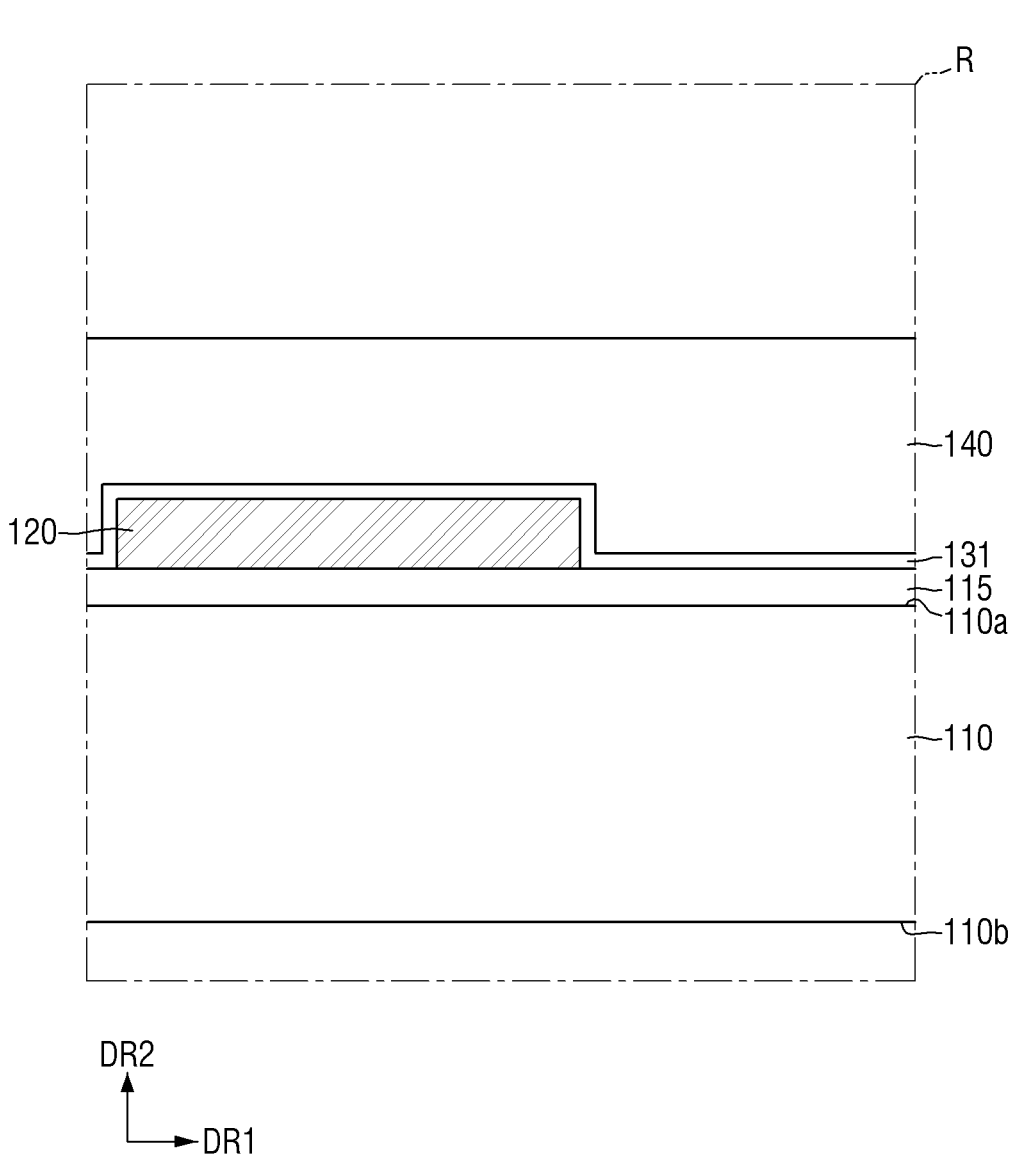
FIGS. 3 to 13 are intermediate stage diagrams of stages in a method for manufacturing an interposer structure according to some embodiments of the present disclosure.

Referring to FIG. 3, the planarization insulation layer 115 may be formed on the upper surface 110a of the interposer substrate 110. Subsequently, the connecting pattern 120 may be formed on the planarization insulation layer 115. The connecting pattern 120 may be formed in a partial region on the planarization insulation layer 115.

Subsequently, the first etching stop layer 131 may be formed on the upper surface of the planarization insulation layer 115, and on the side walls and the upper surface of the connecting pattern 120, e.g., the first etching stop layer 131 may be formed conformally on exposed surfaces of the planarization insulation layer 115 and the connecting pattern 120. Subsequently, the first interlayer insulating layer 140 may be formed on the first etching stop layer 131. For example, the upper surface of the first interlayer insulating layer 140 may be formed at the same height, e.g., at a constant distance from the upper surface 110a of the interposer substrate 110.

Figure 4:
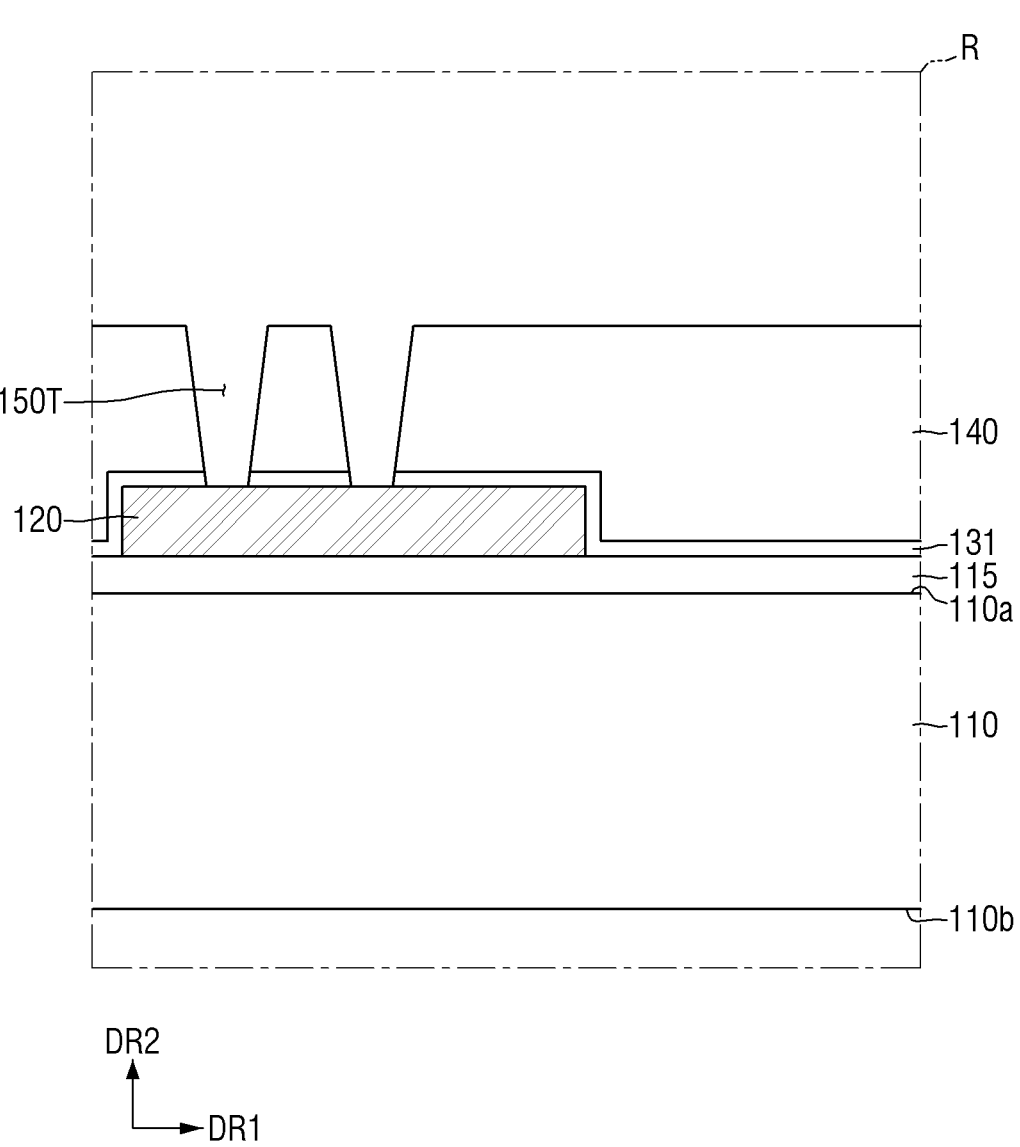

Referring to FIG. 4, the capacitor trench 150T may be formed inside, e.g., through, the first interlayer insulating layer 140 and the first etching stop layer 131, e.g., to expose a part of an upper surface of the connecting pattern 120. The capacitor trench 150T may be formed on the upper surface of the connecting pattern 120. A part of the upper surface of the connecting pattern 120 may be exposed by the capacitor trench 150T.

Figure 5:
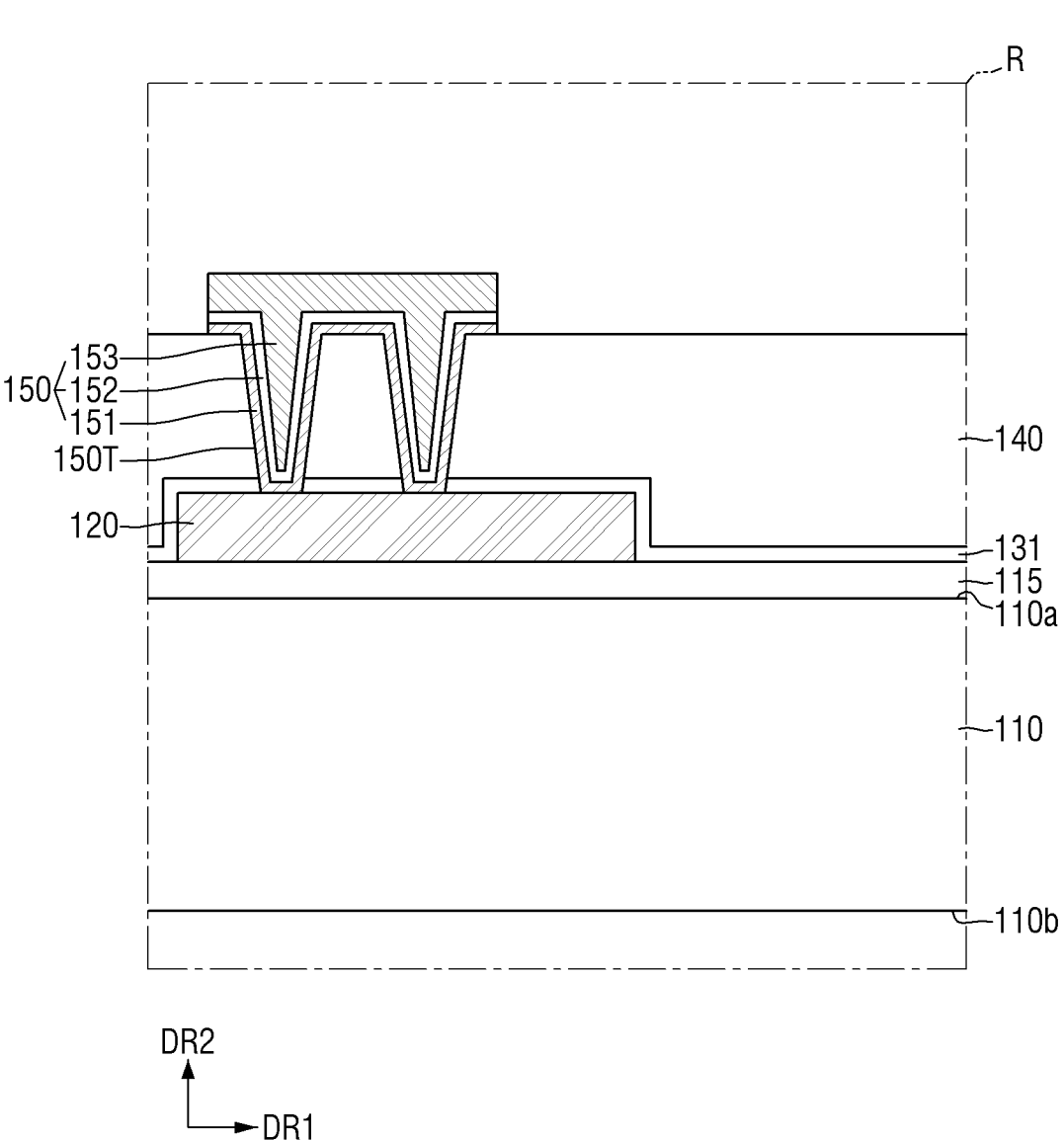

Referring to FIG. 5, the capacitor structure 150 may be formed inside the capacitor trench 150T and above the capacitor trench 150T. In detail, the lower electrode 151 may be formed along the side walls and the bottom surface of the capacitor trench 150T. Further, the lower electrode 151 may also be formed on the upper surface of the first interlayer insulating layer 140. For example, the lower electrode 151 may be formed conformally.

Subsequently, the capacitor dielectric layer 152 may be formed on the lower electrode 151 inside the capacitor trench 150T. Further, the capacitor dielectric layer 152 may also be formed on the lower electrode 151 formed on the upper surface of the first interlayer insulating layer 140. For example, the capacitor dielectric layer 152 may be formed conformally.

Subsequently, the upper electrode 153 may be formed on the capacitor dielectric layer 152 to fill the interior of the capacitor trench 150T. Further, the upper electrode 153 may also be formed on the capacitor dielectric layer 152 formed on the upper surface of the first interlayer insulating layer 140. For example, the upper surface of the upper electrode 153 may be formed at the same height, e.g., at a constant distance from the upper surface 110a of the interposer substrate 110.

Subsequently, each of the lower electrode 151, the capacitor dielectric layer 152, and the upper electrode 153 formed on the upper surface of the first interlayer insulating layer 140 may be etched through a patterning process. For example, after performing the patterning process, the remaining lower electrode 151, the capacitor dielectric layer 152, and the upper electrode 153 may each completely overlap the connecting pattern 120 in the vertical direction DR2, e.g., the connecting pattern 120 may extend beyond lateral surfaces of the lower electrode 151, the capacitor dielectric layer 152, and the upper electrode 153 in the horizontal direction DR1.

Figure 6:
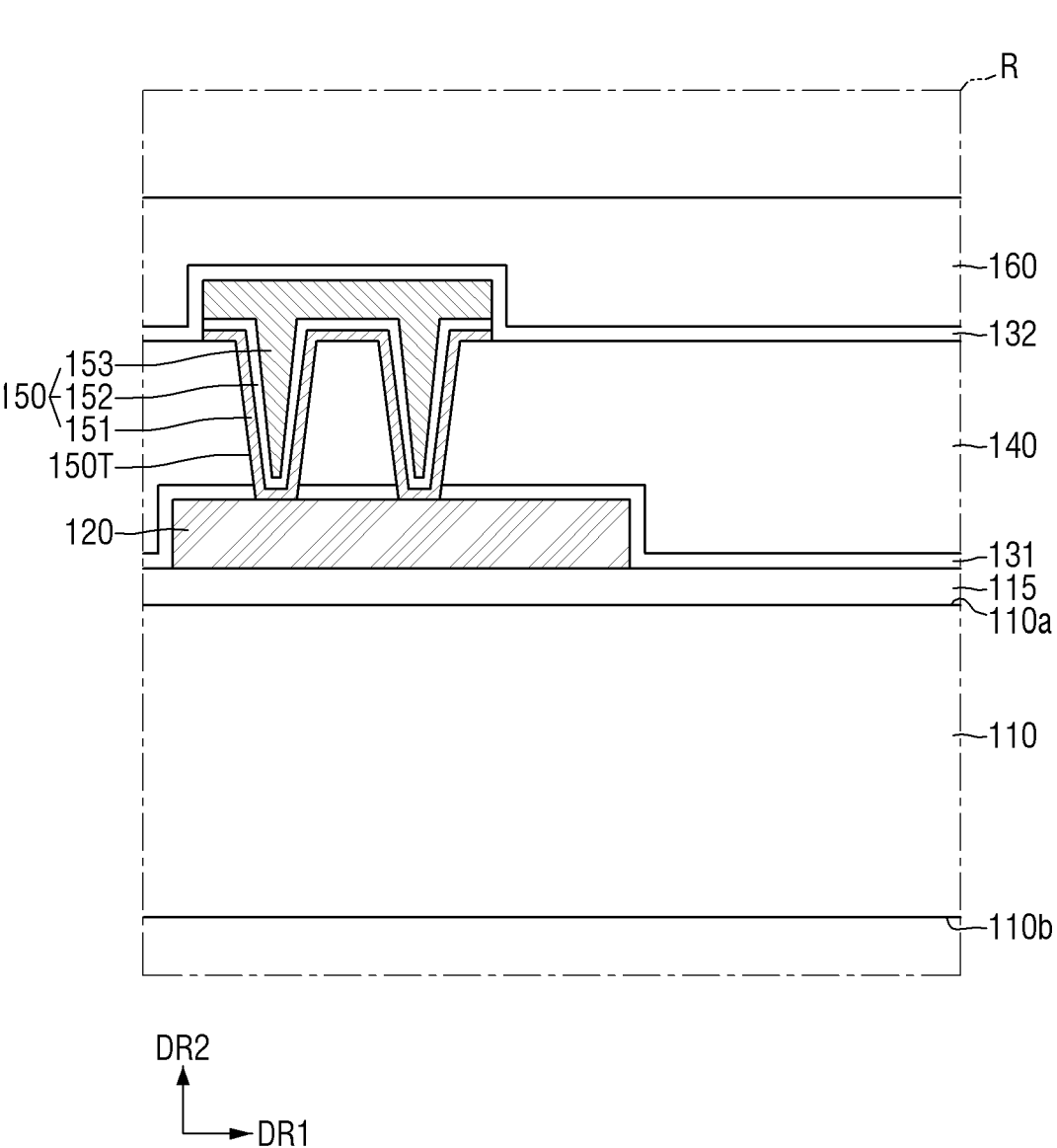

Referring to FIG. 6, the second etching stop layer 132 may be formed on the upper surface of the first interlayer insulating layer 140, and on the side walls and upper surface of the capacitor structure 150. Subsequently, the second interlayer insulating layer 160 may be formed on the second etching stop layer 132. For example, the upper surface of the second interlayer insulating layer 160 may be formed at the same height, e.g., at a constant distance from the upper surface 110a of the interposer substrate 110.

Figure 7:
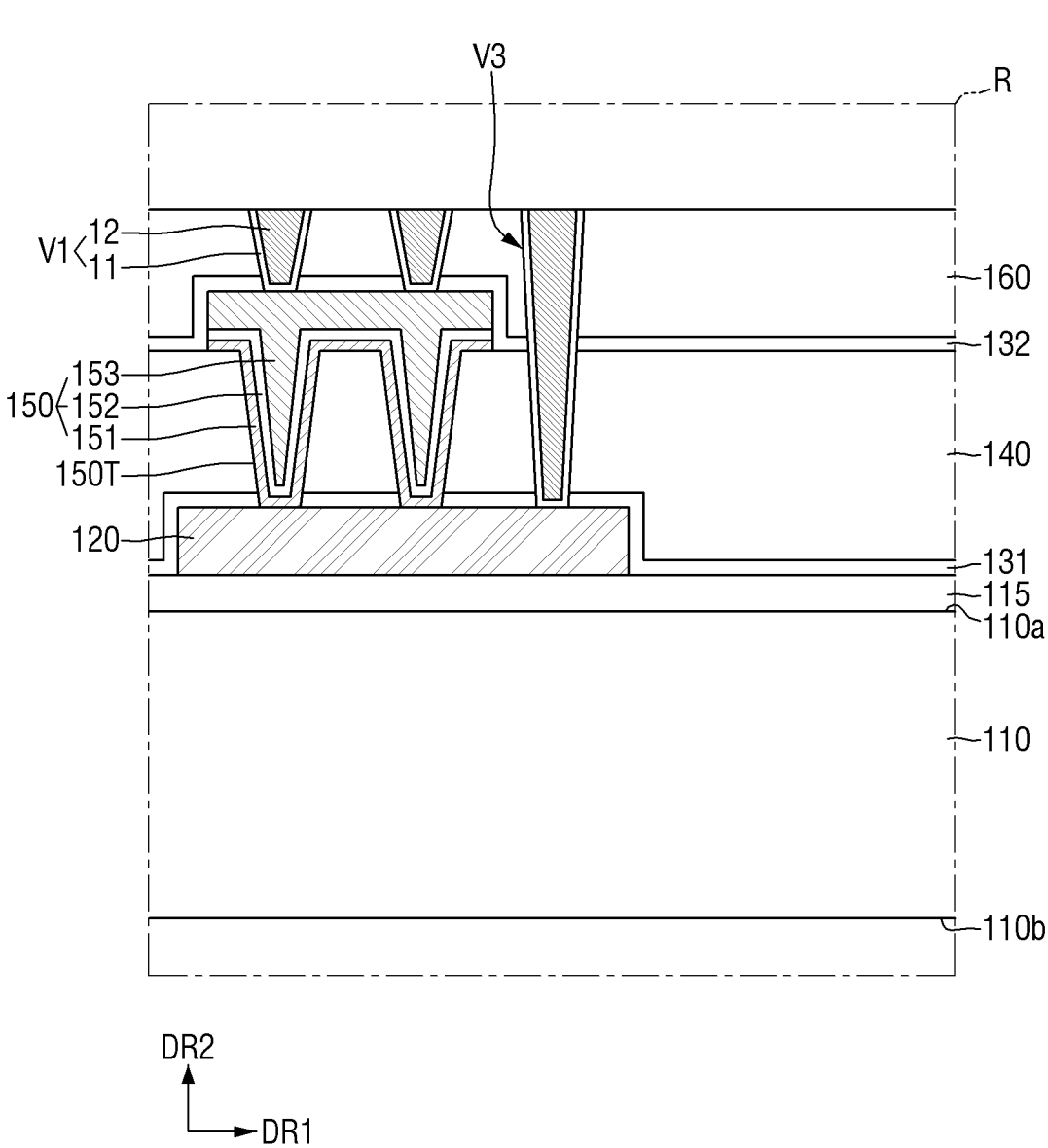

Referring to FIG. 7, the first via V1 may be formed on the upper surface of the capacitor structure 150. The first via V1 may penetrate the second interlayer insulating layer 160 and the second etching stop layer 132 in the vertical direction DR2, and may be connected to the capacitor structure 150.

Further, the third via V3 may be formed on the side walls of the capacitor structure 150. The third via V3 may penetrate the second interlayer insulating layer 160, the second etching stop layer 132, the first interlayer insulating layer 140, and the first etching stop layer 131 in the vertical direction DR2, and may be connected to the connecting pattern 120. The upper surface of the first via V1, the upper surface of the third via V3, and the upper surface of the second interlayer insulating layer 160 may be formed on the same plane, e.g., level with each other, through a planarization process.

Figure 8:
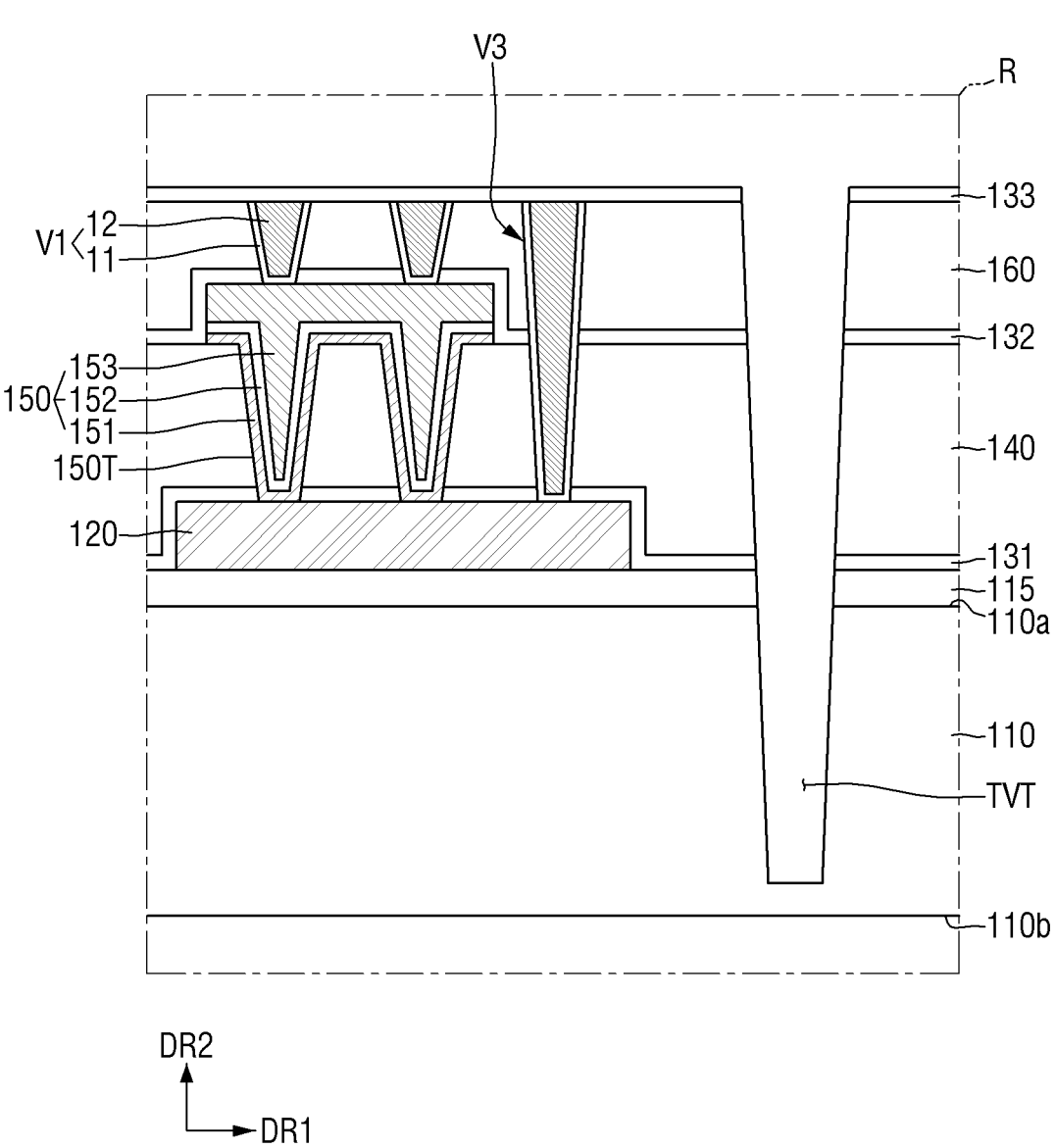

Referring to FIG. 8, the third etching stop layer 133 may be formed on the upper surface of the second interlayer insulating layer 160, the upper surface of the first via V1, and the upper surface of the third via V3. Subsequently, the through via trench TVT may be formed on the side wall of the connecting pattern 120. The through via trench TVT may penetrate the third etching stop layer 133, the second interlayer insulating layer 160, the second etching stop layer 132, the first interlayer insulating layer 140, the first etching stop layer 131, and the planarization insulation layer 115 in the vertical direction DR2, and may extend into the interposer substrate 110. The lower surface of the through via trench TVT may be formed inside the interposer substrate 110.

Figure 9:
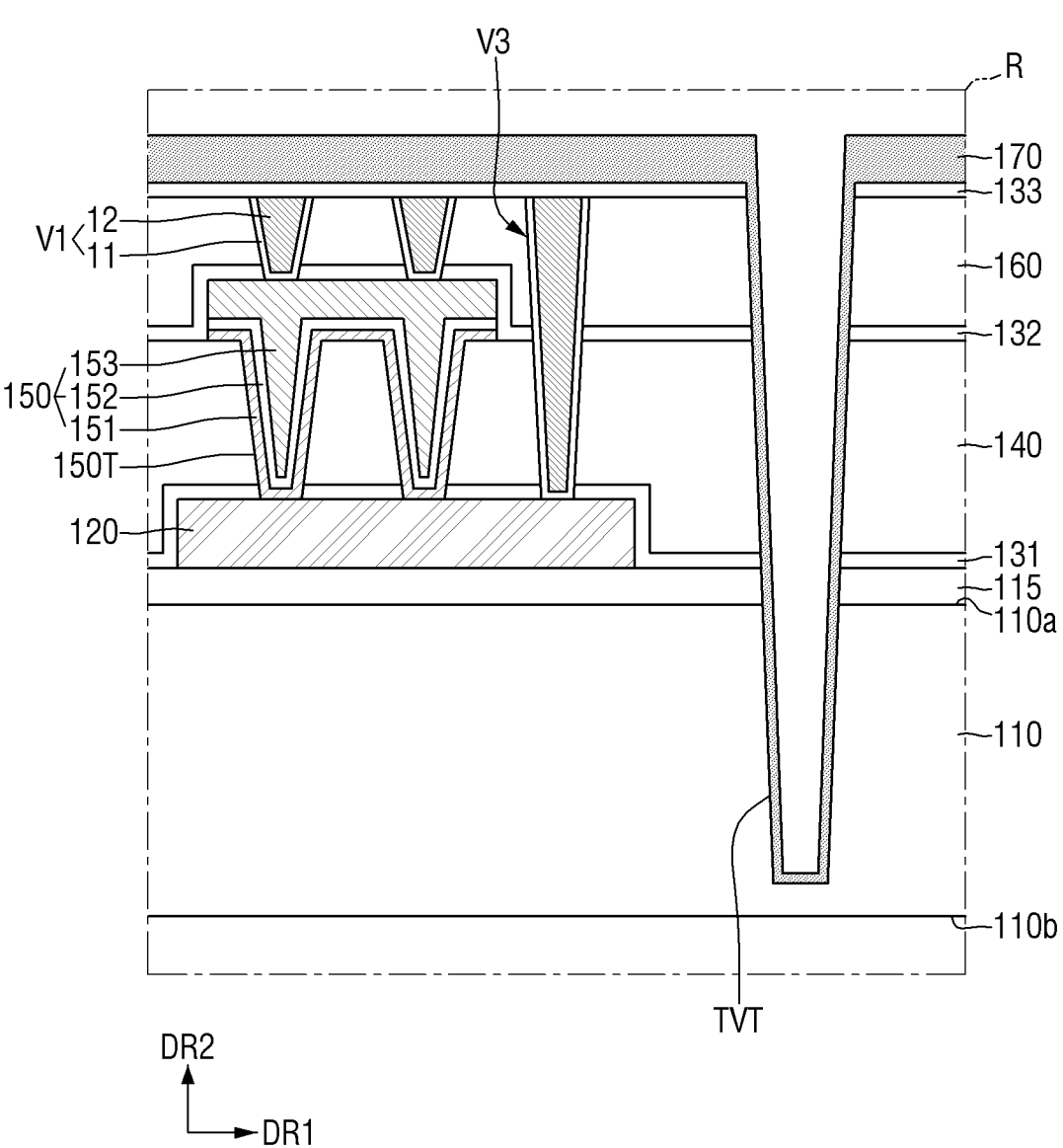

Referring to FIG. 9, the insulating layer 170 may be formed on the third etching stop layer 133. The insulating layer 170 may be formed along the side walls and bottom surface of the through via trench TVT. For example, as illustrated in FIG. 9, the insulating layer 170 may be formed directly on the, e.g., entire, upper surface of the third etching stop layer 133, and may extend continuously from the upper surface of the third etching stop layer 133 into the via trench TVT to cover the, e.g., entire, sidewalls and bottom surface of the through via trench TVT. For example, the thickness in the vertical direction DR2 of the insulating layer 170 formed on the third etching stop layer 133 may be greater than the thickness of the insulating layer 170 formed on the side walls and the bottom surface of the through via trench TVT.

Figure 10:
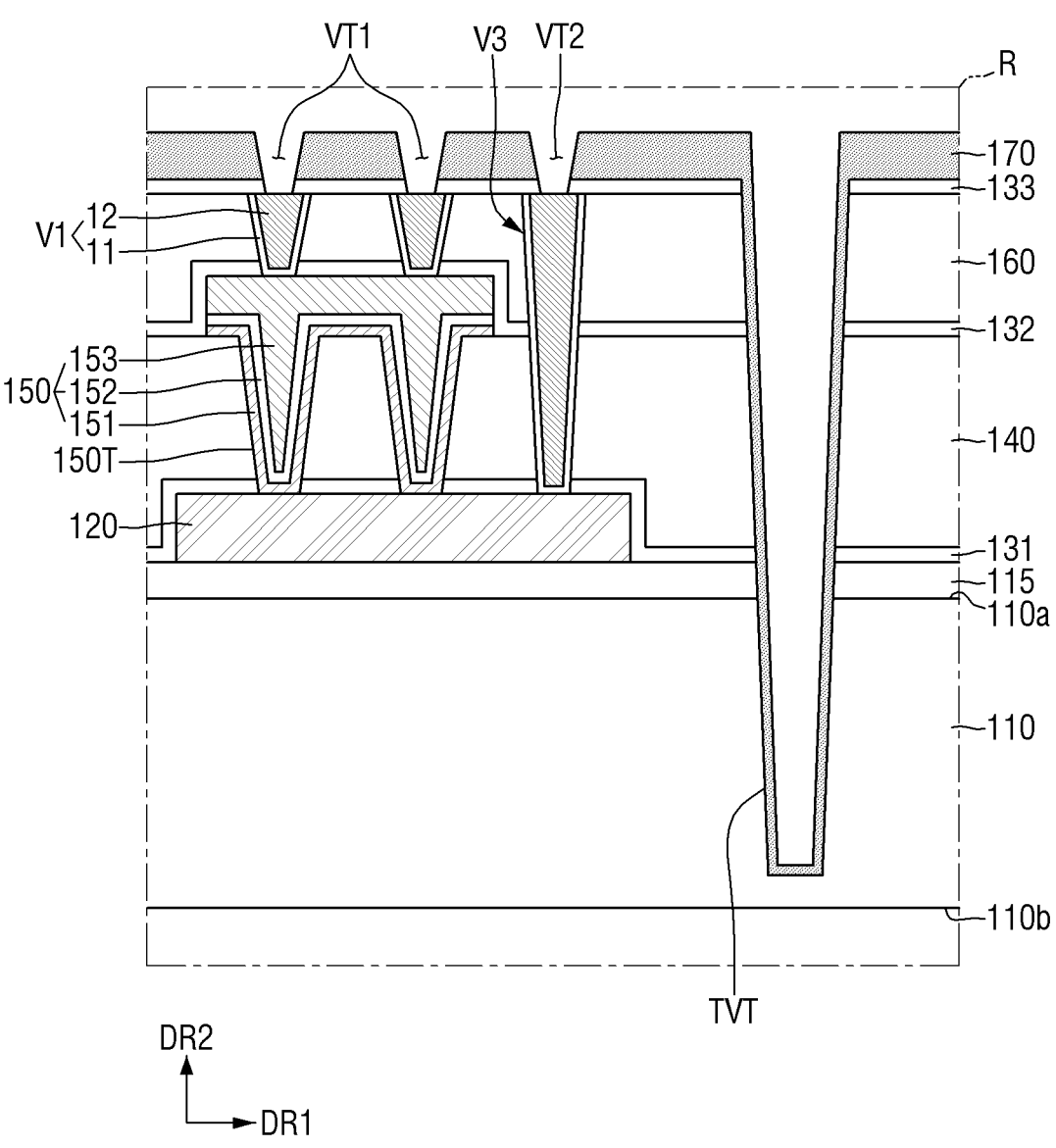

Referring to FIG. 10, the first via trench VT1 may be formed on the upper surface of the first via V1. The first via trench VT1 may penetrate the insulating layer 170 and the third etching stop layer 133 in the vertical direction DR2, and may extend to the upper surface of the first via V1. Further, the second via trench VT2 may be formed on the upper surface of the third via V3. The second via trench VT2 may penetrate the insulating layer 170 and the third etching stop layer 133 in the vertical direction DR2, and may extend to the upper surface of the third via V3.

For example, a protective layer may be filled inside the through via trench TVT before each of the first via trench VT1 and the second via trench VT2 is formed. After each of the first via trench VT1 and the second via trench VT2 is formed, the protective layer may be removed.

Figure 11:
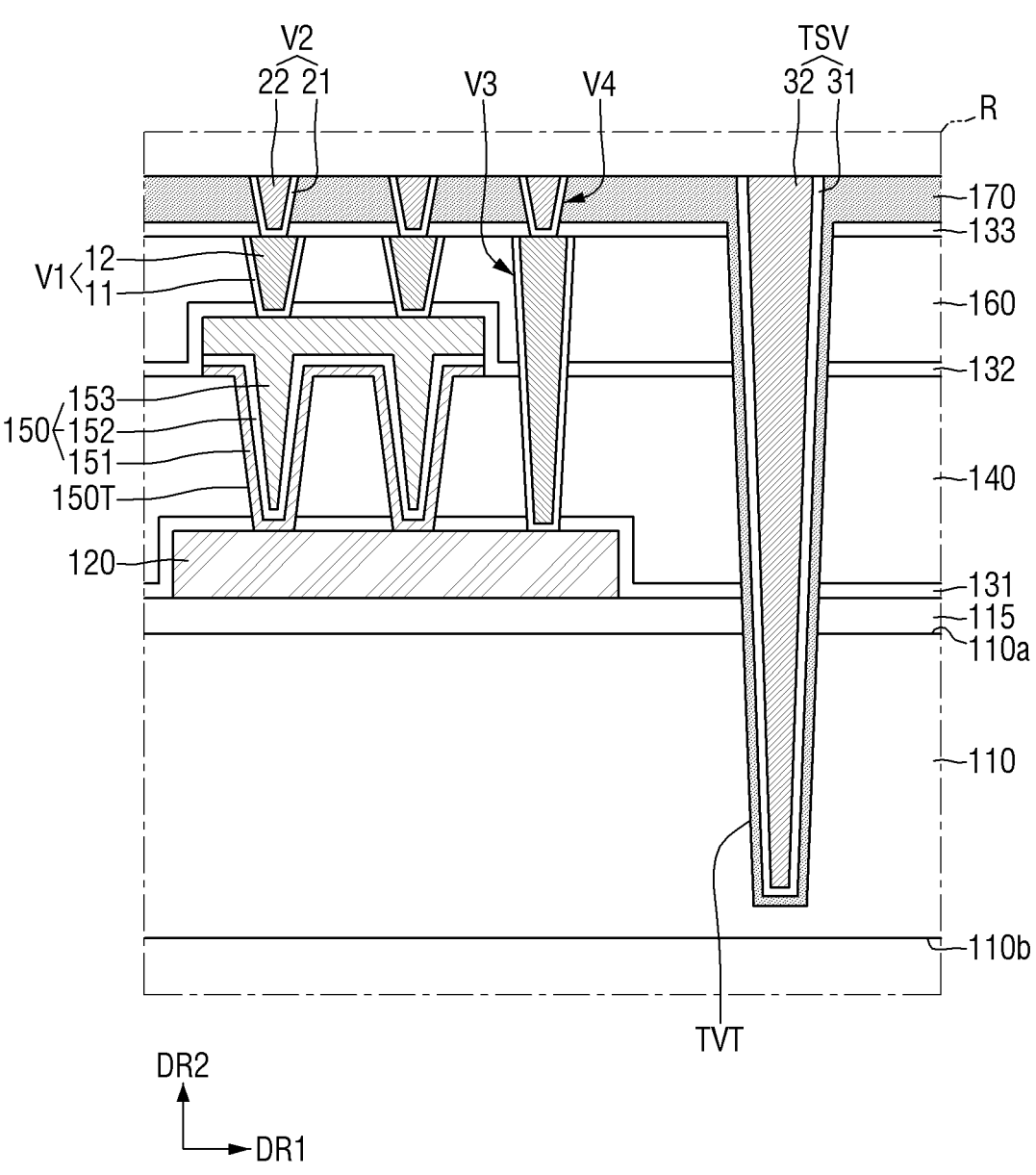

Referring to FIG. 11, the second via V2 may be formed inside the first via trench (VT1 of FIG. 10). Further, the fourth via V4 may be formed inside the second via trench (VT2 of FIG. 10). Further, the through via TSV may be formed on the insulating layer 170 inside the through via trench TVT.

In detail, the second via V2, the fourth via V4, and the through via TSV may be formed through the same manufacturing process, e.g., simultaneously via a same deposition process and a same planarization process. The second via V2, the fourth via V4, and the through via TSV may include the same material as each other. The upper surface of the second via V2, the upper surface of the fourth via V4, the upper surface of the through via TSV, and the upper surface of the insulating layer 170 may each be formed on the same plane, e.g., to be coplanar or level with each other, through the same planarization process.

Figure 12:
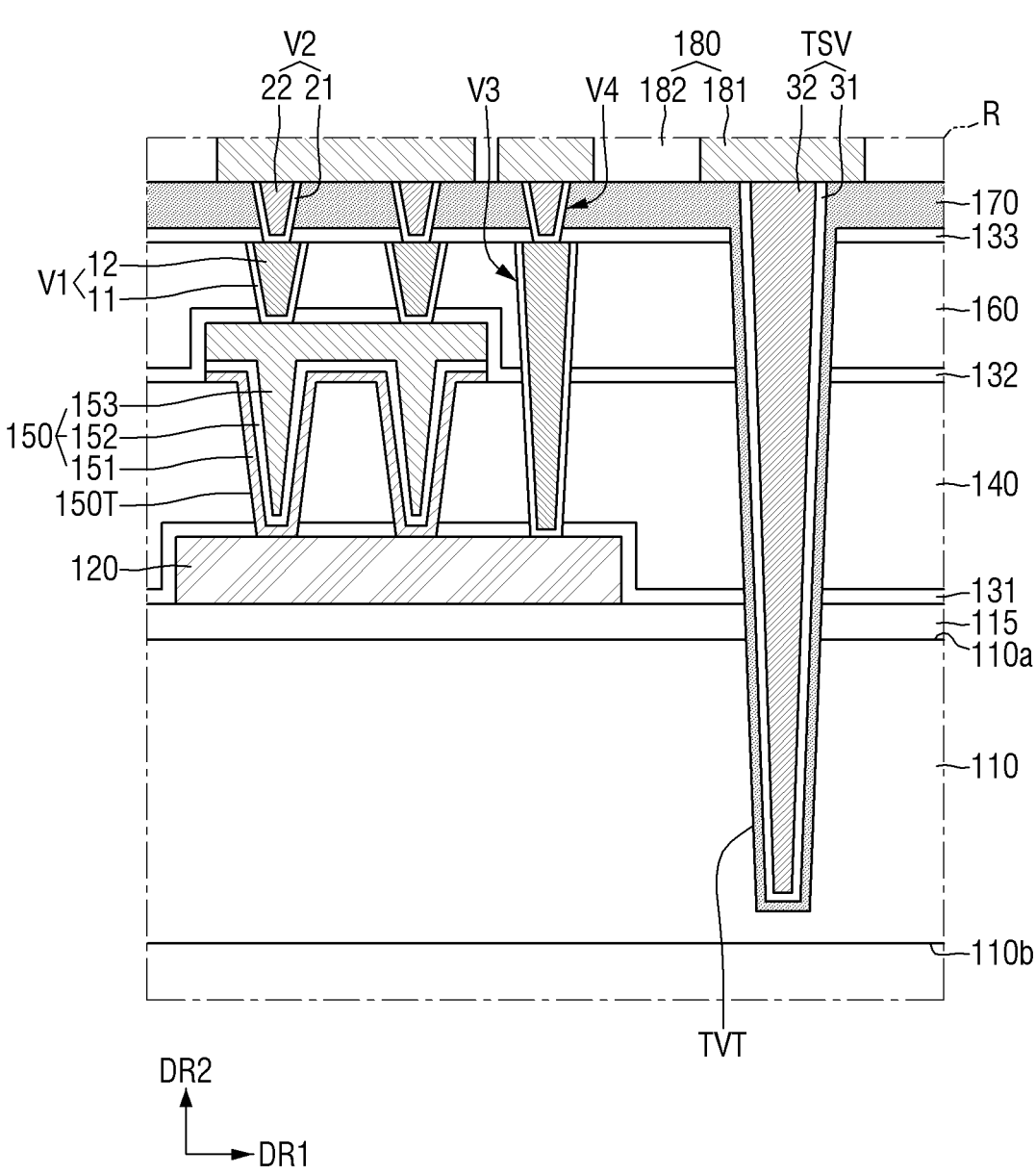

Referring to FIG. 12, the redistribution layer 180 may be formed on the upper surface of the insulating layer 170, the upper surface of the second via V2, the upper surface of the fourth via V4, and the upper surface of the through via TSV. The redistribution layer 180 may include a second wiring pattern 181, and a third interlayer insulating layer 182 that surrounds the second wiring pattern 181. The second wiring pattern 181 may be in contact with each of the second via V2, the fourth via V4, and the through via TSV.

Figure 13:
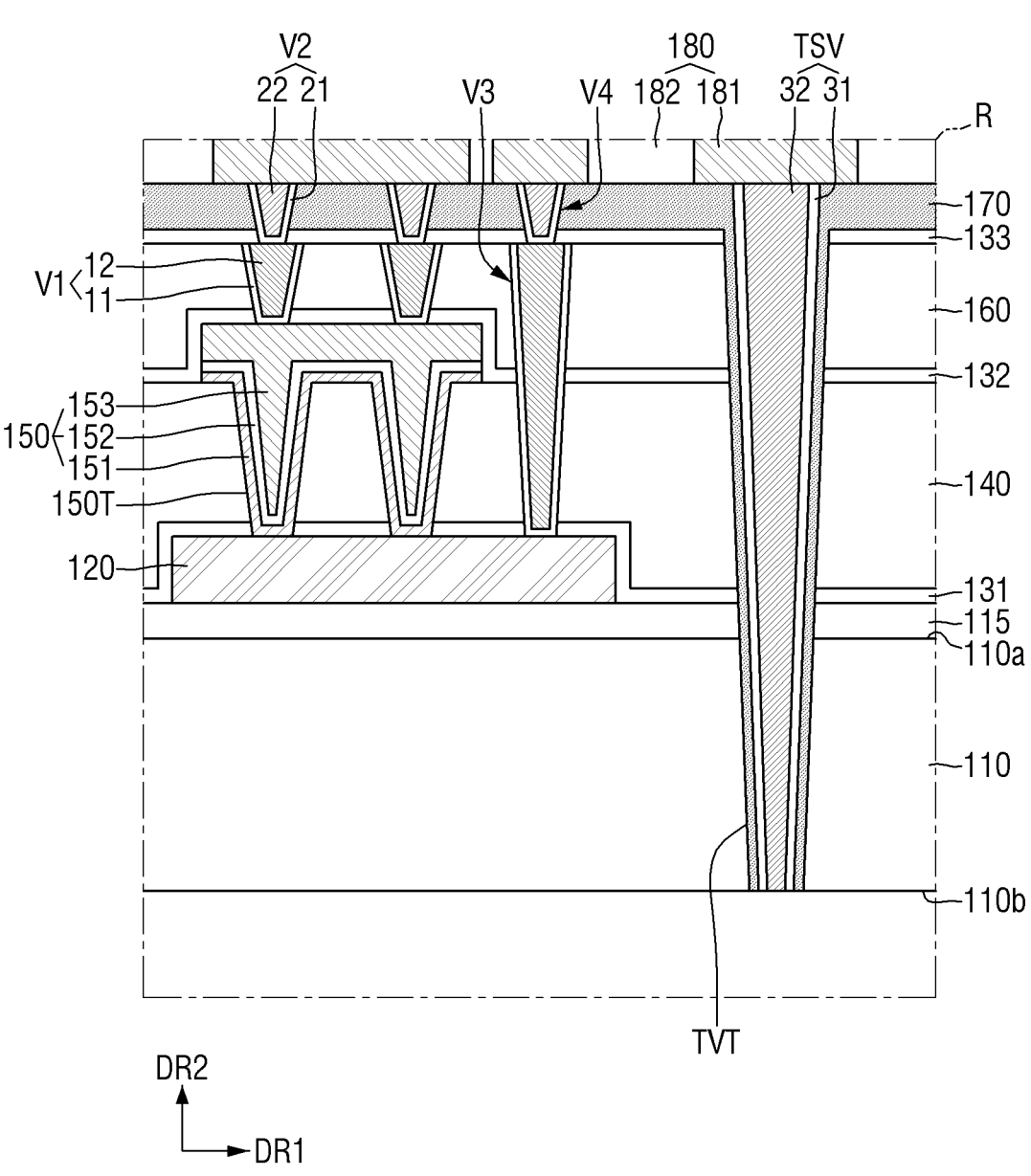

Referring to FIG. 13, a part of the lower surface 110*b* of the interposer substrate 110 may be etched, e.g., so a thickness of the interposer substrate 110 along the vertical direction DR2 may be reduced. Further, a part of the insulating layer 170 and a part of the through via TSV formed on the bottom surface of the through via trench TVT may be etched during etching of the lower surface 110*b* of the interposer substrate 110. As a result, the insulating layer 170, the through via barrier layer 31, and the through via filling layer 32 may be exposed on, e.g., through, the lower surface 110*b* of the interposer substrate 110, e.g., to be level with the lower surface 110*b* of the interposer substrate 110.

Referring to FIGS. 1 and 2, the first wiring pattern 111 may be formed on the lower surface 110*b* of the interposer substrate 110. The first wiring pattern 111 may be in contact with each of the insulating layer 170 and the through via TSV formed inside the through via trench TVT. The interposer structure 100 shown in FIGS. 1 and 2 may be manufactured through such a manufacturing process.

In the interposer structure according to some embodiments of the present disclosure, the insulating layer 170 is disposed on each of the first via V1 and the third via V3, and each of the second via V2 and the fourth via V4 may be disposed on each of the first via V1 and the third via V3 inside, e.g., through, the insulating layer 170. Further, the through via TSV may penetrate the insulating layer 170 and extend to the lower surface 110*b* of the interposer substrate 110.

Such a structure of the interposer structure 100 according to some embodiments of the present disclosure may be due to the formation of the second via V2, the fourth via V4, and the through via TSV by the same manufacturing process, e.g., simultaneously by a same deposition process. The upper surfaces of each of the second via V2, the fourth via V4, and the through via TSV may be formed on the same plane through a planarization process. That is, the interposer structure according to some embodiments of the present disclosure may be manufactured by a manufacturing method with a simplified manufacturing process, by forming the second via V2, the fourth via V4 and the through via TSV through the same manufacturing process.

Hereinafter, an interposer structure according to some other embodiments of the present disclosure will be described referring to FIG. 14. Differences relative to the interposer structure shown in FIGS. 1 and 2 will be mainly described.

Figure 14:
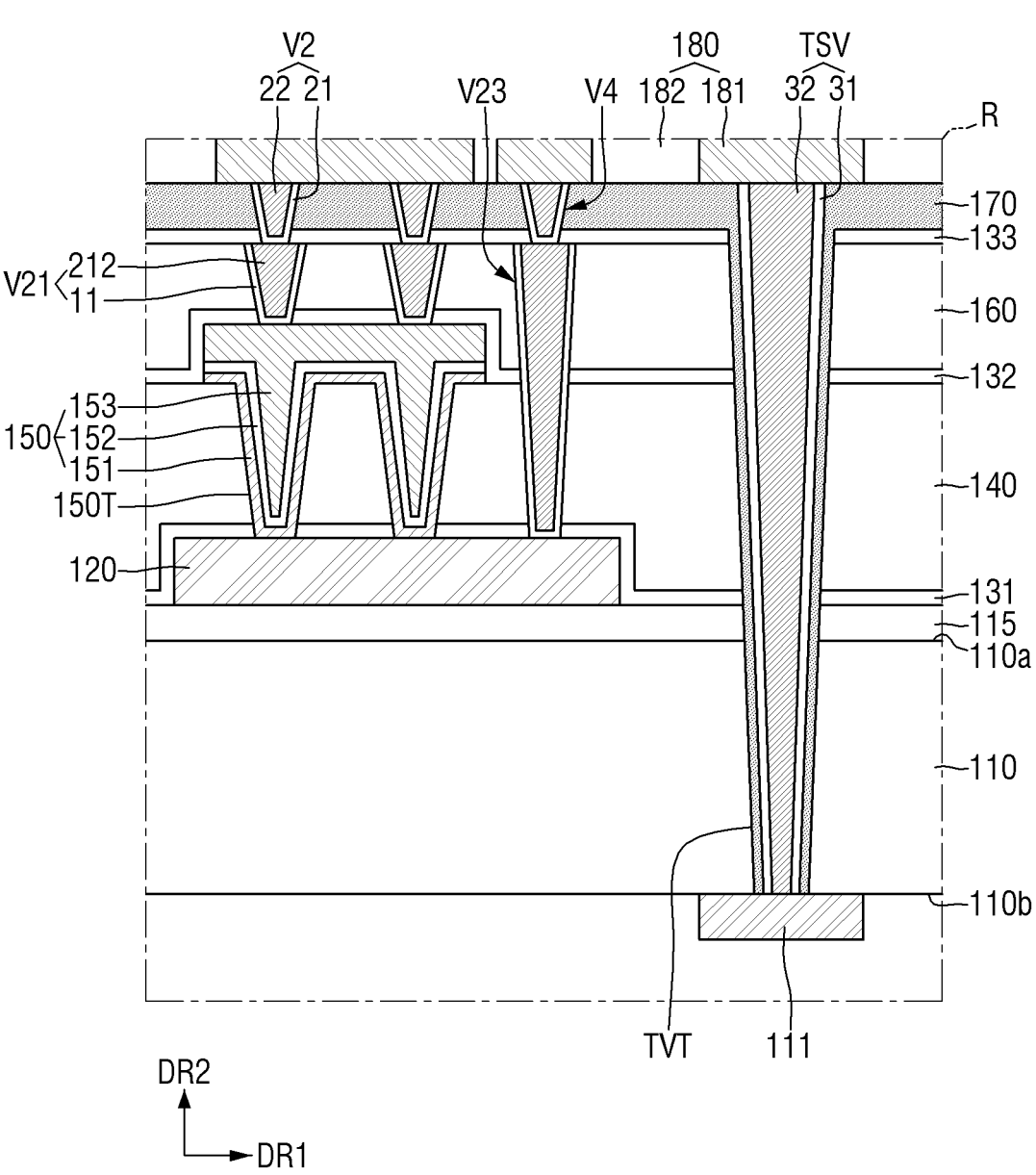
FIG. 14 is a diagram of an interposer structure according to some other embodiments of the present disclosure.

FIG. 14 is an enlarged cross-sectional view of an interposer structure according to some other embodiments of the present disclosure. FIG. 14 corresponds to region R of FIG. 2.

Referring to FIG. 14, in an interposer structure according to some other embodiments of the present disclosure, a first via V21, a second via V2, a third via V23, a fourth via V4, and a through via TSV may each include the same material.

For example, a first via filling layer 212 of each of the first via V21 and the third via V23 may include the same material as the second via filling layer 22 of each of the second via V2 and the fourth via V4. For example, the first via filling layer 212 of each of the first via V21 and the third via V23 may include the same material as the through via filling layer 32 of the through via TSV.

Hereinafter, an interposer structure according to still some other embodiments of the present disclosure will be described referring to FIG. 15. Differences relative to the interposer structure shown in FIGS. 1 and 2 will be mainly described.

Figure 15:
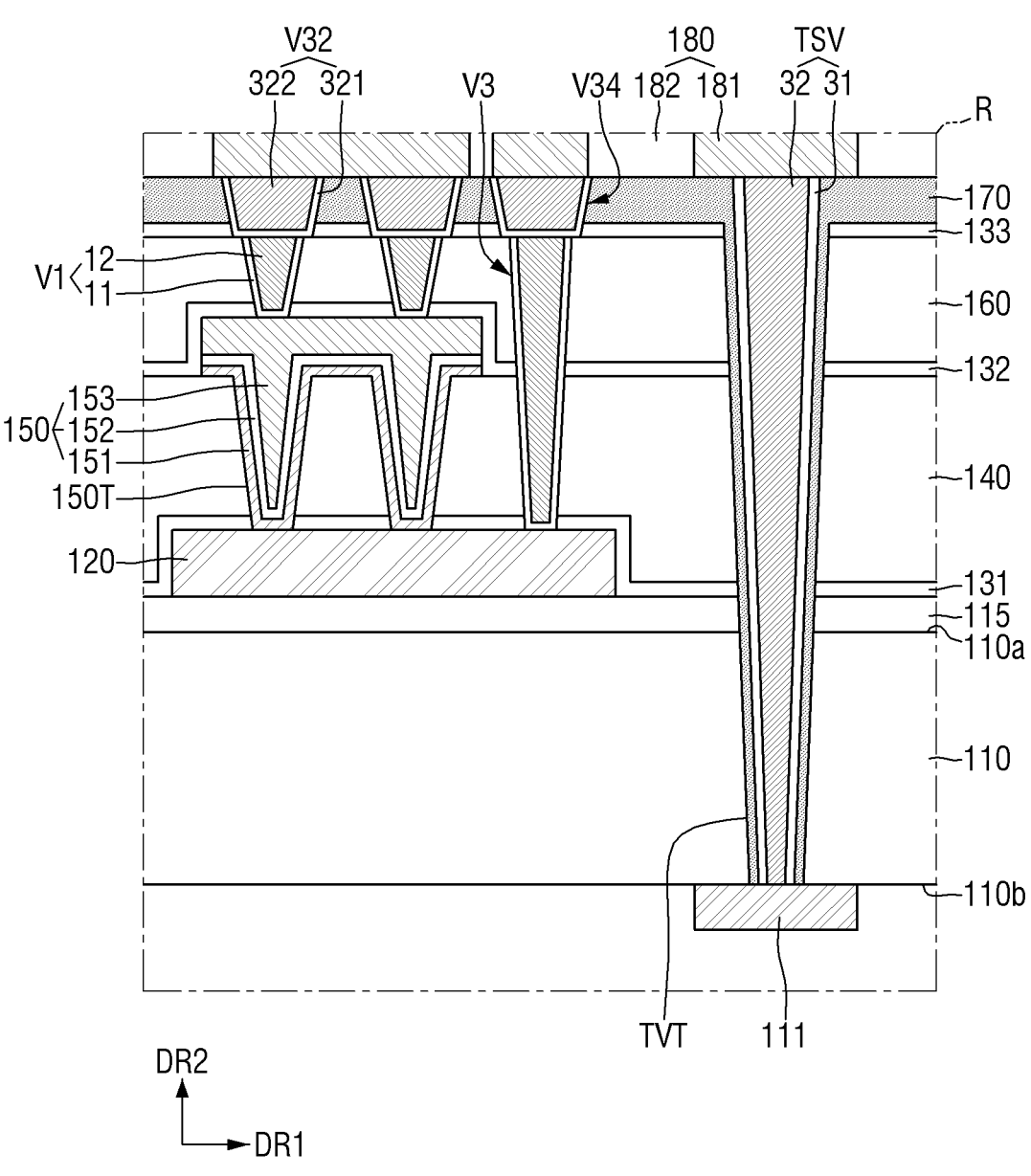
FIG. 15 is a diagram of an interposer structure according to some other embodiment of the present disclosure.

FIG. 15 is a cross-sectional view of an interposer structure according to some other embodiment of the present disclosure. FIG. 15 corresponds to region R of FIG. 2.

Referring to FIG. 15, in an interposer structure according to still some other embodiments of the present disclosure, a width in the horizontal direction DR1 of the lower surface of the second via V32 may be greater than a width in the horizontal direction DR1 of the upper surface of the first via V1. Further, the width in the horizontal direction DR1 of the lower surface of the fourth via V34 may be greater than the width in the horizontal direction DR1 of the upper surface of the third via V3. Each of the second via V32 and the fourth via V34 may include a second via barrier layer 321 that forms the side walls and the bottom surface, and a second via filling layer 322 disposed on the second via barrier layer 321.

Hereinafter, an interposer structure according to yet some other embodiments of the present disclosure will be described referring to FIG. 16. Differences relative to the interposer structure shown in FIGS. 1 and 2 will be mainly described.

Figure 16:
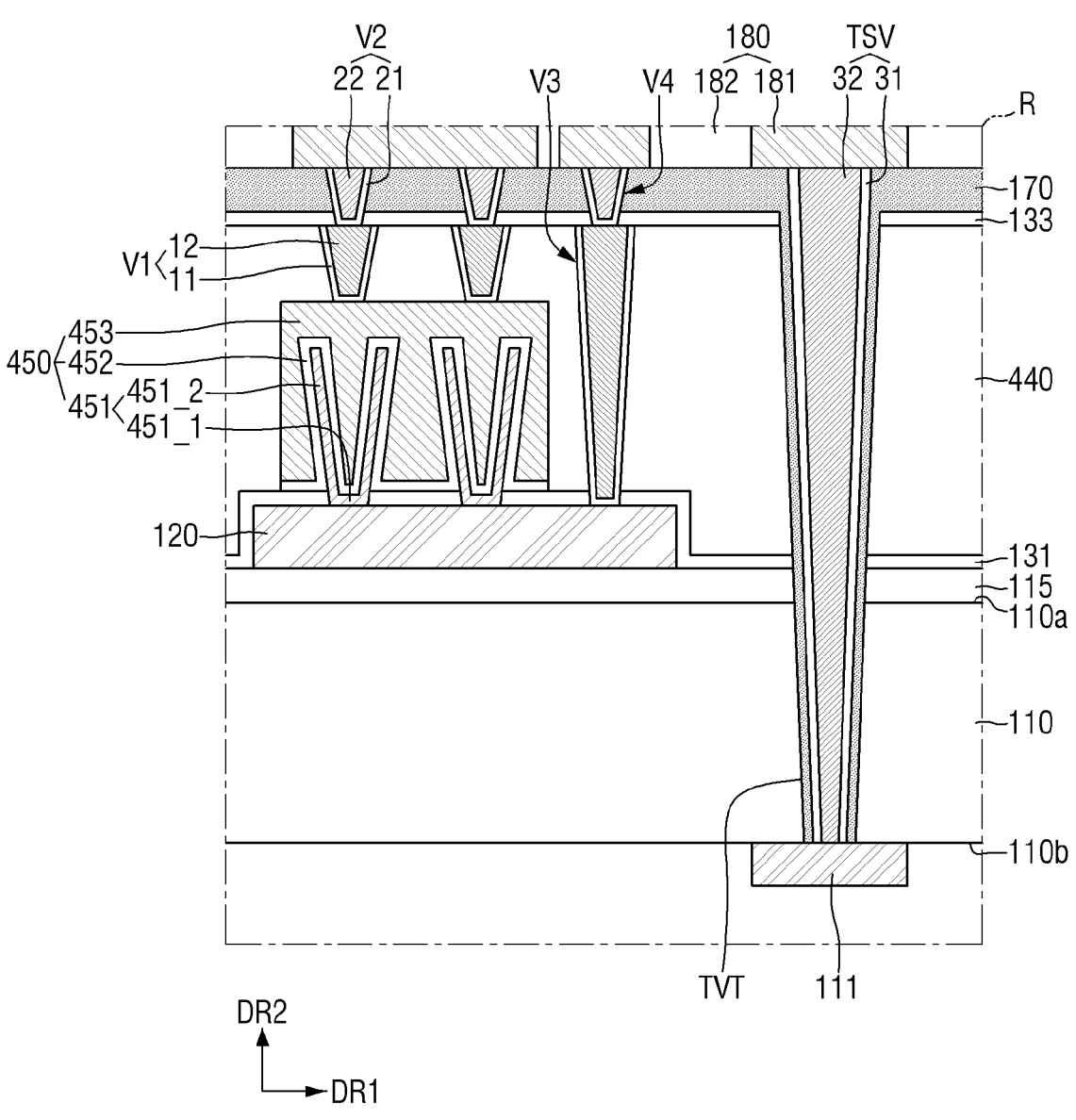
FIG. 16 is a diagram of an interposer structure according to still some other embodiments of the present disclosure.

FIG. 16 is a cross-sectional view of an interposer structure according to yet some other embodiments of the present disclosure. FIG. 16 corresponds to region R of FIG. 2.

Referring to FIG. 16, in an interposer structure according to yet some other embodiment of the disclosure, a capacitor structure 450 may include a lower electrode 451, a capacitor dielectric layer 452, and an upper electrode 453.

The lower electrode 451 may include a first portion 451_1 that is in contact with the connecting pattern 120, and a second portion 451_2 extending from the first portion 451_1 toward the upper surface of the first interlayer insulating layer 440. The second portion 451_2 of the lower electrode 451 may be connected to the edge of the first portion 451_1 of the lower electrode 451. For example, the width in the horizontal direction DR1 between the second portions 451_2 of the lower electrode 451 may increase toward the upper surface of the first interlayer insulating layer 440.

The capacitor dielectric layer 452 may be disposed along a part of the uppermost surface of the first etching stop layer 131 and the surface of the second portion 451_2 of the lower electrode 451. For example, the capacitor dielectric layer 452 may completely surround the surface of the second portion 451_2 of the lower electrode 451.

The upper electrode 453 may be disposed on the capacitor dielectric layer 452. The upper electrode 453 may surround the second portion 451_2 of the lower electrode 451. For example, the side walls of the upper electrode 453 that are in contact with the first interlayer insulating layer 440 may be aligned with the side walls of the capacitor dielectric layer 452 that is in contact with the first interlayer insulating layer 440, in the vertical direction DR2.

Hereinafter, a semiconductor package including an interposer structure according to some embodiments of the present disclosure will be described referring to FIG. 17. The contents described referring to FIGS. 1 and 2 will be omitted.

Figure 17:
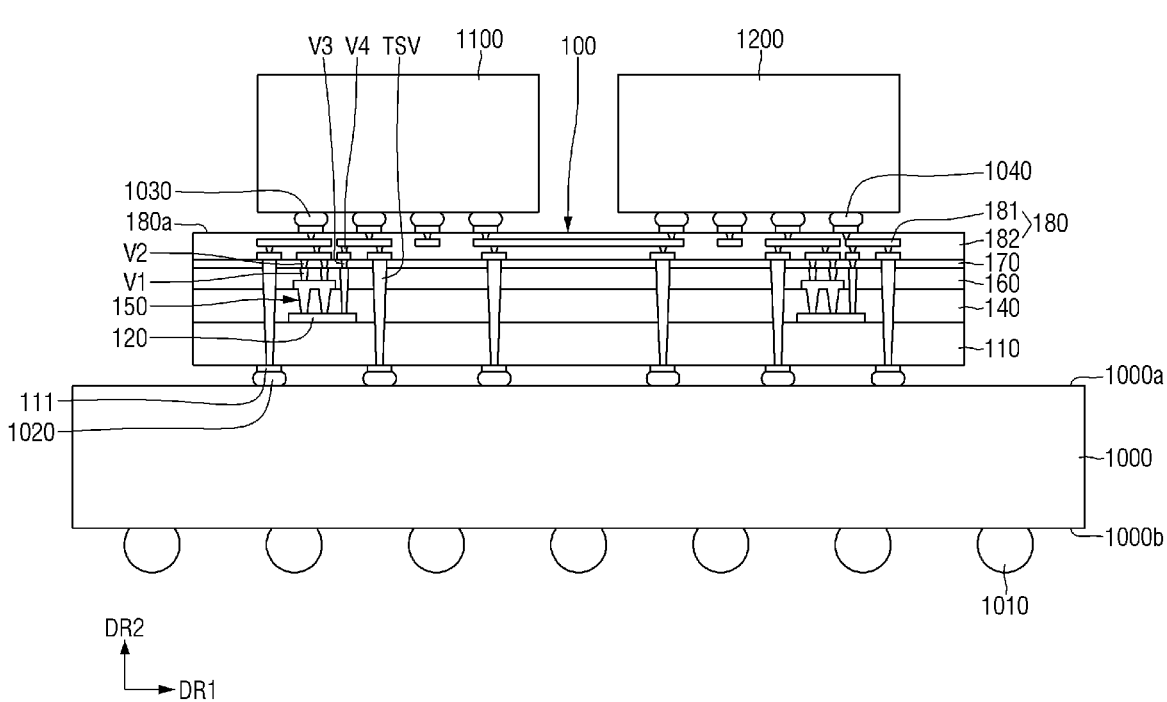
FIG. 17 is a diagram of a semiconductor package which includes an interposer structure according to some embodiments of the present disclosure.

FIG. 17 is a cross-sectional view of a semiconductor package which includes an interposer structure according to some embodiments of the present disclosure.

Referring to FIG. 17, a semiconductor package according to some embodiments of the present disclosure may include the interposer structure 100, a package substrate 1000, a first semiconductor chip 1100, a second semiconductor chip 1200, a first solder ball 1010, a second solder ball 1020, a third solder ball 1030, and a fourth solder ball 1040. The interposer structure 100 may include any of the embodiments described previously with referent to FIGS. 1-16.

The package substrate 1000 may be, e.g., a printed circuit board (PCB) or a ceramic substrate. When the package substrate 1000 is a PCB, the package substrate 1000 may be made of at least one of, e.g., a phenol resin, an epoxy resin, and a polyimide. For example, the package substrate 1000 may include at least one of FR4, tetrafunctional epoxy, polyphenylene ether, epoxy/polyphenylene oxide, bismale-imide triazine (BT), thermount, cyanate ester, polyimide, and liquid crystal polymer.

The first solder ball 1010 may be disposed on a lower surface 1000b of the package substrate 1000. The first solder ball 1010 may be in contact with a conductive terminal disposed on the lower surface 1000b of the package substrate 1000. The first solder ball 1010 may protrude convexly from the lower surface 1000b of the package substrate 1000. The first solder ball 1010 may be a portion by which the package substrate 1000 is electrically connected to another external element.

The interposer structure 100 may be disposed on the upper surface 1000a of the package substrate 1000. The interposer structure 100 may be electrically connected to the package substrate 1000 through the second solder ball 1020. The second solder ball 1020 may be in contact with a conductive terminal disposed on the upper surface 1000a of the package substrate 1000. Further, the second solder ball 1020 may be in contact with a first wiring pattern 111 disposed on the lower surface of the interposer substrate 110.

The first semiconductor chip 1100 may be disposed on the interposer structure 100. Specifically, the first semiconductor chip 1100 may be disposed on the upper surface 180a of the redistribution layer 180. The first semiconductor chip 1100 may be electrically connected to the interposer structure 100 through the third solder ball 1030. The third solder ball 1030 may be in contact with the second wiring pattern 181 disposed on the upper surface 180a of the redistribution layer 180. Further, the third solder ball 1030 may be in contact with the conductive terminals disposed on the lower surface of the first semiconductor chip 1100.

The first semiconductor chip 1100 may be, e.g., a logic semiconductor chip. The first semiconductor chip 1100 may be, e.g., a micro-processor. The first semiconductor chip 1100 may be, e.g., a central processing unit (CPU), a controller, an application specific integrated circuit (ASIC), or the like.

The second semiconductor chip 1200 may be disposed on the interposer structure 100. Specifically, the second semiconductor chip 1200 may be disposed on the upper surface 180a of the redistribution layer 180. The second semiconductor chip 1200 may be spaced apart from the first semiconductor chip 1100 in the horizontal direction DR1. The second semiconductor chip 1200 may be electrically connected to the interposer structure 100 through the fourth solder ball 1040. The fourth solder ball 1040 may be in contact with the second wiring pattern 181 disposed on the upper surface 180a of the redistribution layer 180. Further, the fourth solder ball 1040 may be in contact with the conductive terminal disposed on the lower surface of the second semiconductor chip 1200. The second semiconductor chip 1200 may be electrically connected to the first semiconductor chip 1100 through the redistribution layer 180.

The second semiconductor chip 1200 may be, e.g., an HBM semiconductor chip. For example, the second semiconductor chip 1200 may include a plurality of stacked memory semiconductor chips. Each of the plurality of memory semiconductor chips may be a volatile memory semiconductor chip, e.g., a dynamic random access memory (DRAM) or a static random access memory (SRAM), or non-volatile memory semiconductor chip, e.g., a phase-change random access memory (PRAM), a magneto resistive random access memory (MRAM), a ferroelectric random access memory (FeRAM) or a resistive random access memory (RRAM).

Each of the first to fourth solder balls 1010, 1020, 1030, and 1040 may include, e.g., at least one of tin (Sn), indium (In), lead (Pb), zinc (Zn), nickel (Ni), gold (Au), silver (Ag), copper (Cu), antimony (Sb), bismuth (Bi), and combinations thereof.

By way of summation and review, aspects of the present disclosure provide an interposer structure manufactured by a simplifying process. That is, the present disclosure relates to an interposer structure that includes forming the second via V2, the fourth via V4, and the through via TSV by a same manufacturing process, e.g., simultaneously via a same deposition process and a same planarization process, such that upper surfaces of the second via V2, the fourth via V4, and the through via TSV may be coplanar, e.g., level, with each other.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An interposer structure, comprising:

an interposer substrate;

an interlayer insulating layer on an upper surface of the interposer substrate;

a capacitor structure inside the interlayer insulating layer;

a first via which penetrates the interlayer insulating layer in a vertical direction, the first via being connected to the capacitor structure;

an insulating layer on the interlayer insulating layer;

an etching stop layer between an upper surface of the interlayer insulating layer and the insulating layer;

a second via which penetrates each of the insulating layer and the etching stop layer in the vertical direction, the second via being connected to the first via; and a through via which completely penetrates each of the interposer substrate, the interlayer insulating layer, the etching stop layer, and the insulating layer in the vertical direction, an upper surface of the through via being coplanar with an upper surface of the second via;

wherein the insulating layer extends through the etching stop layer and extends along side walls of the through via to a lower surface of the interposer substrate, the through via comprising a tapered shape with an increasing width from a bottom end of the through via to a top end of the through via.

2. The interposer structure as claimed in claim 1, further comprising:

a connecting pattern in contact with the capacitor structure, the connecting pattern being between the upper surface of the interposer substrate and the capacitor structure;

a third via which penetrates the interlayer insulating layer in the vertical direction, the third via being on a side wall of the capacitor structure and being connected to the connecting pattern; and a fourth via which penetrates the insulating layer in the vertical direction, the fourth via being connected to the third via, the fourth via comprising a tapered shape with an increasing width from a bottom end of the fourth via to a top end of the fourth via.

3. The interposer structure as claimed in claim 2, wherein the upper surface of the second via is coplanar with an upper surface of the fourth via.

4. The interposer structure as claimed in claim 1, further comprising:

a first wiring pattern on the lower surface of the interposer substrate; and a redistribution layer on the insulating layer, the redistribution layer including a second wiring pattern, and the through via being in contact with each of the first wiring pattern and the second wiring pattern.

5. The interposer structure as claimed in claim 1, wherein a width in a horizontal direction of an upper surface of the first via is different from a width in the horizontal direction of a lower surface of the second via.

6. The interposer structure as claimed in claim 1, wherein the second via and the through via include the same material.

7. The interposer structure as claimed in claim 1, wherein the first via and the second via include different materials from each other.

8. The interposer structure as claimed in claim 1, further comprising a second etching stop layer extending between the upper surface of the interposer substrate and the interlayer insulating layer.

9. The interposer structure as claimed in claim 1, wherein the capacitor structure includes:

a lower electrode along side walls and a bottom surface of a capacitor trench, the capacitor trench being inside the interlayer insulating layer;

a capacitor dielectric layer on the lower electrode inside the capacitor trench; and an upper electrode on the capacitor dielectric layer inside the capacitor trench and above the capacitor trench.

10. The interposer structure as claimed in claim 1, wherein the capacitor structure includes:

a lower electrode which includes a first portion and a second portion protruding from the first portion toward the upper surface of the interlayer insulating layer;

a capacitor dielectric layer which completely surrounds a surface of the second portion of the lower electrode; and an upper electrode on the capacitor dielectric layer.

11. An interposer structure, comprising:

an interposer substrate;

a first etching stop layer on an upper surface of the interposer substrate;

a first interlayer insulating layer on the first etching stop layer;

a second etching stop layer on the first interlayer insulating layer;

a second interlayer insulating layer on the second etching stop layer;

a capacitor structure inside the first interlayer insulating layer and the second interlayer insulating layer;

a third etching stop layer on the second interlayer insulating layer;

a first via which penetrates each of the second interlayer insulating layer and the second etching stop layer in a vertical direction, the first via being connected to the capacitor structure;

an insulating layer on the third etching stop layer;

a second via which penetrates each of the insulating layer and the third etching stop layer in the vertical direction, the second via being connected to the first via; and a through via which completely penetrates each of the interposer substrate, the first to third etching stop layers, the first and second interlayer insulating layers, and the insulating layer in the vertical direction, the insulating layer extending along side walls of the through via to a lower surface of the interposer substrate.

12. The interposer structure as claimed in claim 11, wherein an upper surface of the second via is coplanar with an upper surface of the through via.

13. The interposer structure as claimed in claim 11, further comprising:

a connecting pattern in contact with the capacitor structure, the connecting pattern being between the upper surface of the interposer substrate and the capacitor structure;

a third via which penetrates each of the first etching stop layer, the second etching stop layer, the first interlayer insulating layer, and the second interlayer insulating layer in the vertical direction, the third via being adjacent to a side wall of the capacitor structure and being connected to the connecting pattern; and a fourth via which penetrates the insulating layer and the third etching stop layer in the vertical direction, the fourth via being connected to the third via.

14. The interposer structure as claimed in claim 13, wherein an upper surface of the second via is coplanar with an upper surface of the fourth via.

15. The interposer structure as claimed in claim 11, further comprising:

a first wiring pattern on the lower surface of the interposer substrate; and a redistribution layer on the insulating layer, the redistribution layer including a second wiring pattern, wherein the through via is in contact with each of the first wiring pattern and the second wiring pattern.

16. The interposer structure as claimed in claim 11, wherein a width in a horizontal direction of an upper surface of the first via is greater than a width in the horizontal direction of a lower surface of the second via.

17. The interposer structure as claimed in claim 11, wherein the capacitor structure includes:

a lower electrode along side walls and a bottom surface of a capacitor trench, the capacitor trench being inside the first etching stop layer and the first interlayer insulating layer;

a capacitor dielectric layer on the lower electrode inside the capacitor trench; and an upper electrode on the capacitor dielectric layer inside the capacitor trench and above the capacitor trench.

18. A semiconductor package, comprising:

a package substrate;

an interposer substrate on the package substrate;

an interlayer insulating layer on an upper surface of the interposer substrate;

a capacitor structure inside the interlayer insulating layer;

a first via which penetrates the interlayer insulating layer in a vertical direction, the first via being connected to the capacitor structure;

an insulating layer on the interlayer insulating layer;

an etching stop layer between an upper surface of the interlayer insulating layer and the insulating layer;

a second via which penetrates each of the insulating layer and the etching stop layer in the vertical direction, the second via being connected to the first via;

a first wiring pattern on a lower surface of the interposer substrate;

a redistribution layer on the insulating layer, the redistribution layer including a second wiring pattern;

a through via which completely penetrates each of the interposer substrate, the interlayer insulating layer, the etching stop layer, and the insulating layer in the vertical direction, the through via being in contact with each of the first wiring pattern and the second wiring pattern, and an upper surface of the through via being coplanar with an upper surface of the second via;

a first semiconductor chip on an upper surface of the redistribution layer; and a second semiconductor chip on the upper surface of the redistribution layer, the second semiconductor chip being spaced apart from the first semiconductor chip in a horizontal direction, and the second semiconductor chip being electrically connected to the first semiconductor chip through the redistribution layer;

wherein the insulating layer extends through the etching stop layer and extends along side walls of the through via to the lower surface of the interposer substrate, the through via comprising a tapered shape with an increasing width from a bottom end of the through via to a top end of the through via.

\* \* \* \* \*